(12) United States Patent
Fujiwara et al.

(10) Patent No.: US 12,224,557 B2
(45) Date of Patent: Feb. 11, 2025

(54) SEMICONDUCTOR OPTICAL DEVICE AND METHOD OF MANUFACTURING THE SAME

(71) Applicant: SUMITOMO ELECTRIC INDUSTRIES, LTD., Osaka (JP)

(72) Inventors: Naoki Fujiwara, Osaka (JP); Akira Furuya, Osaka (JP); Naoya Kono, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 741 days.

(21) Appl. No.: 17/501,226

(22) Filed: Oct. 14, 2021

(65) Prior Publication Data

US 2022/0131344 A1    Apr. 28, 2022

(30) Foreign Application Priority Data

Oct. 28, 2020    (JP) .................................. 2020-180851

(51) Int. Cl.
*H01S 5/125*    (2006.01)
*H01S 5/10*    (2021.01)
*H01S 5/22*    (2006.01)

(52) U.S. Cl.
CPC ............ *H01S 5/125* (2013.01); *H01S 5/1028* (2013.01); *H01S 5/2206* (2013.01)

(58) Field of Classification Search
None
See application file for complete search history.

(56) References Cited

U.S. PATENT DOCUMENTS

| 2010/0265980 A1* | 10/2010 | Matsuda | ................ B82Y 20/00 372/46.01 |
| 2015/0093121 A1* | 4/2015 | Matsuda | ................ H01S 5/125 398/188 |

OTHER PUBLICATIONS

Kazuya Ohira et al., "Low-Threshold Distributed Reflector Laser Consisting of Wide and Narrow Wirelike Active Regions", IEEE Photonics Technology Letters, vol. 17, No. 2, Feb. 2005, pp. 264-266.

* cited by examiner

*Primary Examiner* — Tuan N Nguyen
(74) *Attorney, Agent, or Firm* — Volpe Koenig

(57) ABSTRACT

A semiconductor optical device in which a light emitting region that emits light and a reflecting region that reflects the light to the light emitting region side are integrated includes a core layer that is provided in the light emitting region, and a waveguide layer that is provided in the reflecting region, that is optically coupled to the core layer, and that has a band gap that is larger than energy of the light. The reflecting region has a first thyristor that overlaps the waveguide layer in a direction that intersects a propagation direction of the light.

9 Claims, 22 Drawing Sheets

SEMICONDUCTOR OPTICAL DEVICE AND METHOD OF MANUFACTURING THE SAME

CROSS REFERENCE TO RELATED APPLICATIONS

This application claims priority based on Japanese Patent Application No. 2020-180851, filed on Oct. 28, 2020, and the entire contents of the Japanese patent application are incorporated herein by reference.

TECHNICAL FIELD

The present disclosure relates to a semiconductor optical device and a method of manufacturing the same.

BACKGROUND

As a light source used in optical communication or the like, semiconductor optical device having a butt joint structure in which a semiconductor laser element and the other optical elements are integrated is known. A DR (distributed reflector) laser in which a DFB (distributed feed-back) laser having a core layer of a multi quantum well structure and a DBR (distributed Bragg reflector) are integrated (for example, Non-Patent Document 1). To improve optical output by reflecting light emitted from a light emitting region where a DFB laser or the like is formed by a reflecting region where a DBR or the like is formed.

(Non-Patent Document 1) Kazuya Ohira et al., "Low-Threshold Distributed Reflector Laser Consisting of Wide and Narrow Wirelike Active Regions", IEEE PHOTONICS TECHNOLOGY LETTERS, VOL. 17, NO. 2, FEBRUARY 2005

SUMMARY OF THE DISCLOSURE

In semiconductor optical device, it is preferable to selectively inject current into core layer of the light emitting region. However, current may leak from the light emitting region to the reflecting region. The leakage of current may reduce energy efficiency and deteriorate characteristics. It is therefore an object of the present invention to provide semiconductor optical device capable of suppressing current leakage and a method of manufacturing the same.

According to an embodiment of the present disclosure, a semiconductor optical device in which a light emitting region that emits light and a reflecting region that reflects the light to the light emitting region side are integrated includes a core layer that is provided in the light emitting region, and a waveguide layer that is provided in the reflecting region, that is optically coupled to the core layer, and that has a band gap that is larger than energy of the light. The reflecting region has a first thyristor that overlaps the waveguide layer in a direction that intersects a propagation direction of the light.

According to an embodiment of the present disclosure, a method of manufacturing a semiconductor optical device in which a light emitting region that emits light and a reflecting region that reflects the light to the light emitting region side are integrated includes a step of growing a core layer in the light emitting region, a step of, in the reflecting region, growing a waveguide layer that is optically coupled to the core layer and that has a band gap that is larger than energy of the light, and a step of, in the reflecting region, forming a first thyristor that overlaps the waveguide layer in a direction that intersects a propagation direction of the light.

DESCRIPTION OF EMBODIMENTS OF THE DISCLOSURE

Figure 1A:
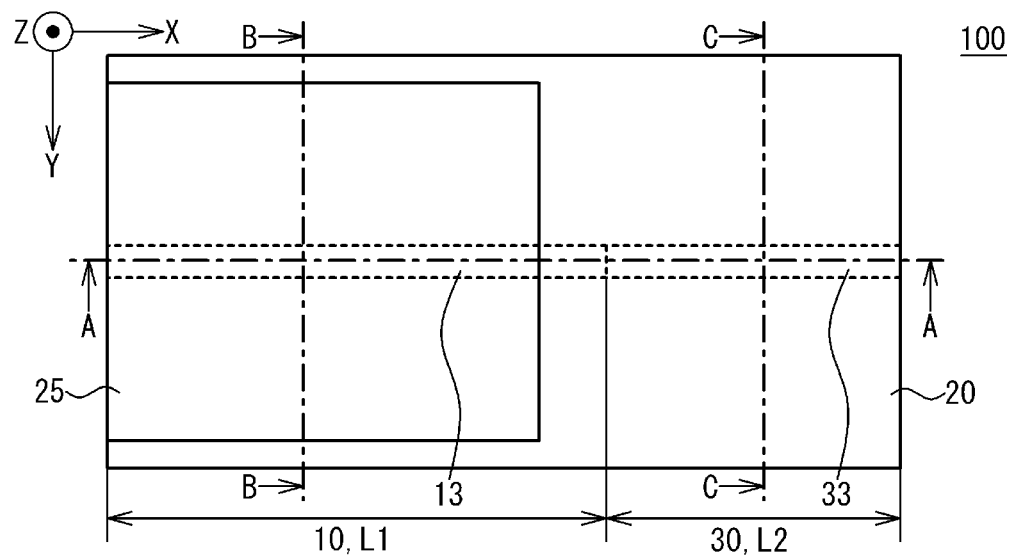
FIG. 1A is a plan view illustrating a semiconductor optical device according to an embodiment.

First, contents of embodiments of the present disclosure will be listed and described.

An aspect of the present disclosure is (1) a semiconductor optical device in which a light emitting region that emits light and a reflecting region that reflects the light to the light emitting region side are integrated includes a core layer that is provided in the light emitting region, and a waveguide layer that is provided in the reflecting region, that is optically coupled to the core layer, and that has a band gap that is larger than energy of the light. The reflecting region has a first thyristor that overlaps the waveguide layer in a direction that intersects a propagation direction of the light. Since the first thyristor is formed in the reflecting region, current leakage into the reflecting region can be suppressed.

(2) The semiconductor optical device may further include a first semiconductor layer of a first conductivity type that is provided below the core layer and the waveguide layer, a second semiconductor layer of a second conductivity type that is provided on the waveguide layer, the second conductivity type differing from the first conductivity type, a third semiconductor layer of the first conductivity type that is provided on the second semiconductor layer, and a fourth semiconductor layer of the second conductivity type that is provided on the core layer and above the second semiconductor layer. The first semiconductor layer, the second semiconductor layer, the third semiconductor layer, and the fourth semiconductor layer may form the first thyristor. Since the first thyristor is formed in the reflecting region, current leakage into the reflecting region can be suppressed.

(3) In the semiconductor optical device, the first semiconductor layer and the core layer may form a first mesa that protrudes in the direction that intersects the propagation direction of the light. The first semiconductor layer and the waveguide layer may form a second mesa that protrudes in the direction that intersects the propagation direction of the light. The first mesa and the second mesa may extend in the propagation direction of the light and are adjacent to each other. The first thyristor may be formed at a position that overlaps the second mesa in the direction that intersects the propagation direction of the light, and on two sides of the second mesa. The light emitting region is a DFB region and the reflecting region is a DBR region. Since the first thyristor is formed in the DBR region so as to overlap the second mesa, current leakage from the DFB region to the DBR region can be suppressed.

(4) In the reflecting region, the second semiconductor layer and the third semiconductor layer may be each provided on the two sides of the second mesa and above the second mesa, the fourth semiconductor layer may be provided on the third semiconductor layer so as to cover an upper side of the second mesa and the two sides of the second mesa, and the first semiconductor layer, the second semiconductor layer, the third semiconductor layer, and the fourth semiconductor layer may form the first thyristor at the position that overlaps the second mesa, and on the two sides of the second mesa. Since the first thyristor is formed at a position overlapping the second mesa in the reflecting region, leakage of current to the reflecting region is suppressed. The current hardly flows in the waveguide layer of the second mesa, and deviation of reflection wavelengths of the reflecting region is suppressed.

(5) In the light emitting region, the second semiconductor layer and the third semiconductor layer may be each provided on two sides of the first mesa, the fourth semiconductor layer may be provided on the third semiconductor layer and above the first mesa, and the first semiconductor layer, the second semiconductor layer, the third semiconductor layer, and the fourth semiconductor layer may form a second thyristor on the two sides of the first mesa. Since current is hard to flow through the second thyristor, current can be selectively injected into the core layer of the first mesa. Since the fourth semiconductor layer serves as a current path, the electrical resistance decreases and heat generation is suppressed. Good characteristics can be obtained even in high-temperature high-output operation.

(6) In the semiconductor optical device, the first mesa may have a first diffraction grating, the second mesa may have a second diffraction grating, and a shape of the first diffraction grating may be the same as a shape of the second diffraction grating. Since the first diffraction grating and the second diffraction grating can be collectively formed, the yield can be improved.

(7) In the semiconductor optical device, a first electrode and a second electrode may be provided at the light emitting region, and at least one of the first electrode and the second electrode may not be provided at the reflecting region. Current is injected into the light emitting region, and light is output. Since no current is injected into the reflecting region, current loss is suppressed.

(8) In the semiconductor optical device, the first semiconductor layer and the third semiconductor layer may each include n-type indium phosphide, and the second semiconductor layer and the fourth semiconductor layer may each include p-type indium phosphide. These layers can be grown by using the same raw material and by switching between an n-type dopant and a p-type dopant.

(9) An aspect of the present disclosure is a method of manufacturing a semiconductor optical device in which a light emitting region that emits light and a reflecting region that reflects the light to the light emitting region side are integrated, the method includes a step of growing a core layer in the light emitting region, a step of, in the reflecting region, growing a waveguide layer that is optically coupled to the core layer and that has a band gap that is larger than energy of the light, and a step of, in the reflecting region, forming a first thyristor that overlaps the waveguide layer in a direction that intersects a propagation direction of the light. Since the first thyristor is formed in the reflecting region, leakage of current to the reflecting region is suppressed.

(10) The method may further include a step of, by etching the core layer and the waveguide layer, forming a first diffraction grating in the core layer and forming a second diffraction grating in the waveguide layer, the second diffraction grating being adjacent to the first diffraction grating. Since the first diffraction grating and the second diffraction grating are collectively formed, the yield can be improved.

DETAILED DESCRIPTION OF EMBODIMENTS OF THE DISCLOSURE

Specific examples of semiconductor optical device and a method of manufacturing the same according to embodiments of the present disclosure will be described below with reference to the drawings. Note that the present disclosure is not limited to these examples, but is defined by the scope of the claims, and is intended to include all modifications within the meaning and scope equivalent to the scope of the claims.

(Semiconductor Optical Device)

Figure 1B:
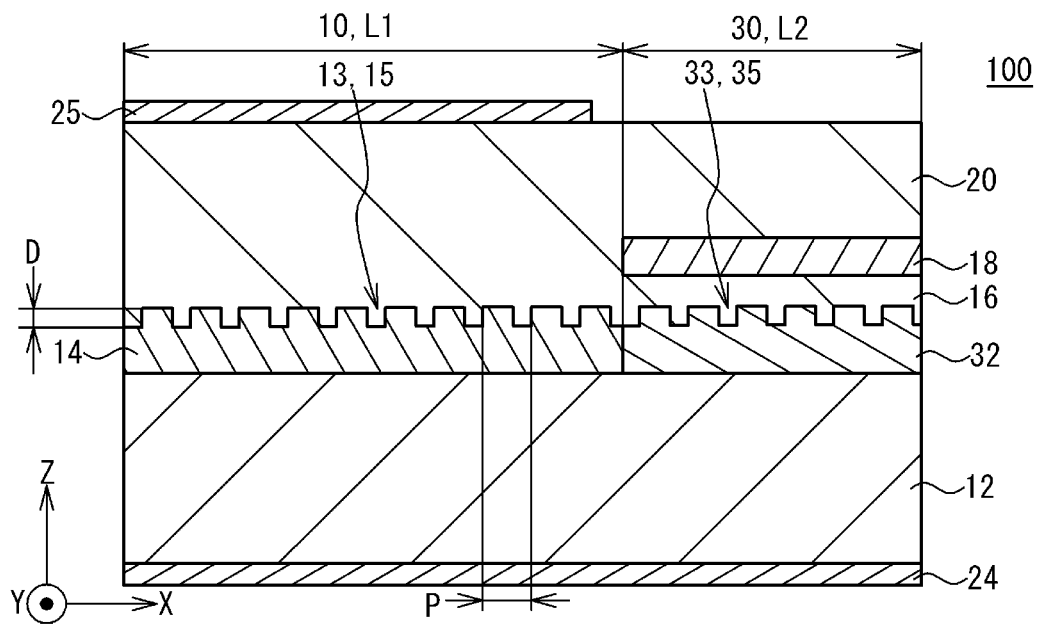
FIG. 1B is a cross-sectional view along line A-A of FIG. 1A.
Figure 2A:
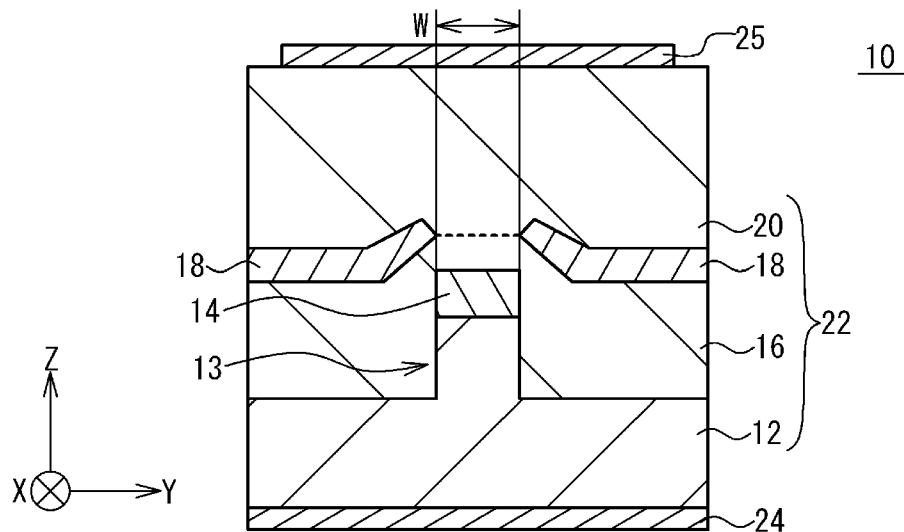
FIG. 2A is a cross-sectional view along line B-B of FIG. 1A.
Figure 2B:
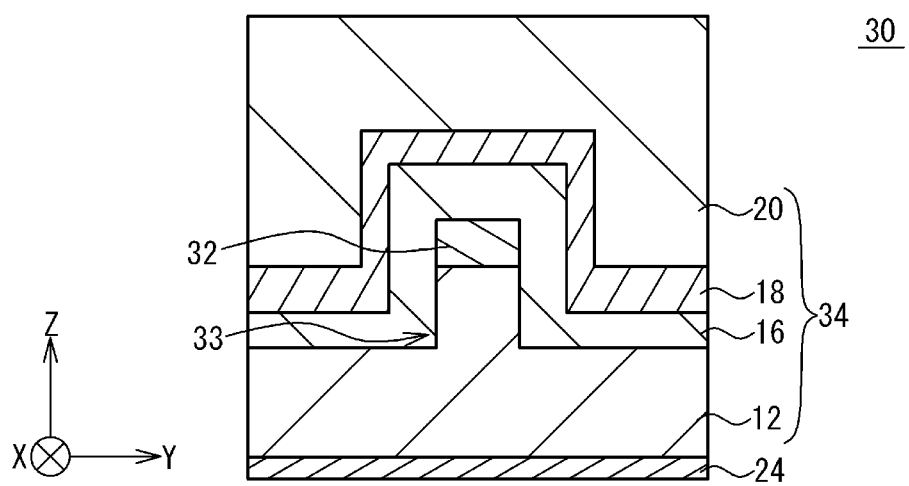
FIG. 2B is a cross-sectional view taken along line C-C of FIG. 1A.

FIG. 1A is a plan view illustrating a semiconductor optical device 100 according to an embodiment. FIG. 1B is a cross-sectional view taken along line A-A of FIG. 1A. FIG. 2A is a cross-sectional view taken along line B-B of FIG. 1A. FIG. 2B is a cross-sectional view taken along line C-C of FIG. 1A. The X-axis direction in the figure is a propagation direction of light. The Z-axis direction is a stacking direction of the layers and is orthogonal to the X-axis direction. The Y-axis direction is orthogonal to the X-axis direction and the Z-axis direction.

As illustrated in FIG. 1A, a planar shape of semiconductor optical device 100 in the XY plane is rectangular and has sides extending in the X-axis direction and sides extending in the Y-axis direction. As illustrated in FIGS. 1A and 1B, semiconductor optical device 100 is a DR (distributed reflector) laser device having a butt-joint structure including a DFB (distributed feed-back) region 10 (light emitting region) and a DBR (distributed Bragg reflector) region 30 (reflecting region). DFB region 10 and DBR region 30 are adjacent to each other in the X-axis direction. A length L1 of DFB region 10 in the X-axis direction and a length L2 of DBR region 30 in the X-axis direction are each, for example, 500 µm. A mesa 13 is provided in DFB region 10. A mesa 33 is provided in DBR region 30. Mesas 13 and 33 are adjacent to each other and extend in the X-axis direction.

FIG. 2A is a cross-sectional view of DFB region 10. A central portion in the Y-axis direction of a substrate 12 (first semiconductor layer) protrudes in the Z-axis direction as compared with the outer portion, and a core layer 14 is laminated on the protruding portion. Substrate 12 and core layer 14 form a first mesa 13 protruding in the Z-axis direction. Mesa 13 has a width W of, for example, 1.5 µm.

An embedding layer 16 (second semiconductor layer) is provided on substrate 12, on two sides of mesa 13 in the Y-axis direction, and on mesa 13, and embeds mesa 13 from the two sides and from above. Two embedding layers 18 (third semiconductor layers) are provided on embedding layer 16. The two embedding layers 18 are arranged in the Y-axis direction, are separated from each other on mesa 13, and sandwich mesa 13. A cladding layer 20 (fourth semiconductor layer) is provided on mesa 13 and embedding layers 18, and is in contact with embedding layer 16 between two embedding layers 18. The dotted line in FIG. 2A is the boundary between embedding layer 16 and cladding layer 20.

An electrode 25 is provided on an upper surface of cladding layer 20 and electrically connected to cladding layer 20. Electrode 25 is formed of a metal such as a laminate of titanium, platinum and gold (Ti/Pt/Au). An electrode 24 is provided on a lower surface of substrate 12 and is electrically connected to substrate 12. Electrode 24 is formed of a metal such as an alloy of gold, germanium and Ni (AuGeNi). As illustrated in FIG. 2A, electrodes 24 and 25 sandwich mesa 13 in the Z-axis direction.

Core layer 14 includes a plurality of well layers and barrier layers formed of, for example, undoped gallium indium arsenide phosphide (i-GaInAsP), and has a multi quantum well (MQW) structure. Substrate 12 is formed of, for example, n-type indium phosphide (n-InP) and functions as an n-type cladding layer. Embedding layer 16 is formed of, for example, p-type InP (p-InP) having a thickness of 800 nm. Embedding layer 18 is formed of, for example, n-InP having a thickness of 500 nm. Cladding layer 20 is made of, for example, p-InP. For example, silicon (Si) is used as an n-type dopant. For example, zinc (Zn) is used as a p-type dopant.

On two sides of mesa 13, n-type substrate 12, p-type embedding layer 16, n-type embedding layer 18, and p-type cladding layer 20 are sequentially stacked, and these four layers form a thyristor 22 (second thyristor). Thyristor 22 extends in the Z-axis direction, suppresses a flow of current in the Z-axis direction, and functions as a current confinement structure.

FIG. 2B is a cross-sectional view of DBR region 30. A central portion in the Y-axis direction of substrate 12 protrudes in the Z-axis direction compared to the outer portion, and a waveguide layer 32 is laminated on the protruding portion. Waveguide layer 32 includes a plurality of well layers and barrier layers formed of, for example, i-GaInAsP, and has an MQW structure. Alternatively, waveguide layer 32 may have, for example, a single-layer structure or a double-layer structure as long as the band gap is larger than the energy of light emitted from DFB region 10. Substrate 12 and waveguide layer 32 form a second mesa 33 protruding in the Z-axis direction. Mesa 33 has the same width and height as mesa 13.

Embedding layer 16 is provided on substrate 12, on two sides of mesa 33 in the Y-axis direction, and on mesa 33, and embeds mesa 33 from the two sides and from above. Embedding layer 18 is provided on embedding layer 16 and embeds mesa 33 from two sides and above. Cladding layer 20 is provided on embedding layer 18. In DBR region 30, n-type substrate 12, p-type embedding layer 16, n-type embedding layer 18, and p-type cladding layer 20 are stacked in this order on a position overlapping with mesa 33 and on two sides of mesa 33, and these four layers form a thyristor 34 (first thyristor).

Thyristor 34 overlaps mesa 33 in the Z-axis direction and is also provided on two sides of mesa 33. Thyristor 34 extends in a direction intersecting with the propagation direction of light, and suppresses the flow of current in the direction. In the example of FIG. 2B, thyristor 34 extends in the Z-axis direction and suppresses the flow of current in the Z-axis direction.

Electrode 24 is provided on the lower surface of substrate 12. Electrode 25 is not provided in DBR region 30. That is, both electrodes 24 and 25 are provided in DFB region 10, and electrode 24 may or may not be provided in DBR region 30. Electrode 25 may or may not be provided in DBR region 30.

FIG. 1B illustrates a cross-section including mesas 13 and 33. Mesa 13 and mesa 33 are arranged along the X-axis direction. Core layer 14 and waveguide layer 32 are adjacent to each other in the X-axis direction and optically couple with each other. Mesa 13 is provided with a diffraction grating 15. The periodic grating along the X-axis direction provided on the upper surface of core layer 14 functions as diffraction grating 15. Mesa 33 is provided with a diffraction grating 35. The periodic grating along the X-axis direction provided on the upper surface of waveguide layer 32 functions as diffraction grating 35. Diffraction grating 15 and diffraction grating 35 are continuous in the X-axis direction. A depth of diffraction grating 15 is equal to a depth of diffraction grating 35. The depth D of the grating is, for example, 20 nm. A pitch of diffraction grating 15 is the same as a pitch of diffraction grating 35. The pitch P is, for example, 240 nm. The coupling coefficient of each of diffraction gratings 15 and 35 is, for example, 50 cm$^{-1}$.

When a voltage is applied to electrodes 24 and 25 and a current is injected into core layer 14, core layer 14 emits light in the X-axis direction. The wavelength of the light is in a range from 1.3 μm to 1.55 μm, for example. DBR region 30 has a high reflectance with respect to the light having the wavelength, and reflects the light toward DFB region 10. Light is emitted from an end face of semiconductor optical device 100 located on an opposite side to DBR region 30. DFB region 10 and DBR region 30 form a resonator, and light reflected by DBR region 30 returns to DFB region 10, thereby obtaining a high optical output.

As illustrated in FIG. 2A, since thyristor 22 is formed on two sides of mesa 13, it is difficult for a current to flow outside mesa 13. Leakage of current to embedding layers 18 and 16 is suppressed. On the other hand, no embedding layer 18 is provided on mesa 13, but a p-type cladding layer 20 is provided thereon. Current confinement is enhanced by thyristor 22, and current can be selectively injected into mesa 13 through cladding layer 20. It is possible to suppress current loss and drive semiconductor optical device 100 with high energy efficiency. Cladding layer 20 has a large width and covers over embedding layer 18 and over mesa 13. By widening cladding layer 20, the electrical resistance decreases, and heat generation can be suppressed. By suppressing heat generation, characteristics are less likely to deteriorate even when a high-output operation is performed at a high temperature.

As illustrated in FIG. 2B, since thyristor 34 is formed at the position overlapping with mesa 33 of DBR region 30 and on two sides of mesa 33, current leakage from DFB region 10 to DBR region 30 is suppressed. The wavelength shift due to carrier accumulation in waveguide layer 32 is suppressed.

(Manufacturing Method)

A method of manufacturing semiconductor optical device 100 will be described. FIGS. 3A, 4A, 5A, 6A, 7A, 8A, 9A, 11A, 13A, 15A, 17A, and 19A are plan views illustrating a method of manufacturing semiconductor optical device 100. FIGS. 3B, 4B, 5B, 6B, 7B, 8B, 9B, 11B, 13B, 15B, 17B, and 19B are cross-sectional views taken along each line A-A of the corresponding plan views. FIGS. 10A, 12A, 14A, 16A, 18A, and 20A are cross-sectional views taken along each line B-B of the corresponding plan views. FIGS. 10B, 12B, 14B, 16B, 18B, and 20B are cross-sectional views taken along each line C-C of the corresponding plan views.

Figure 3A:
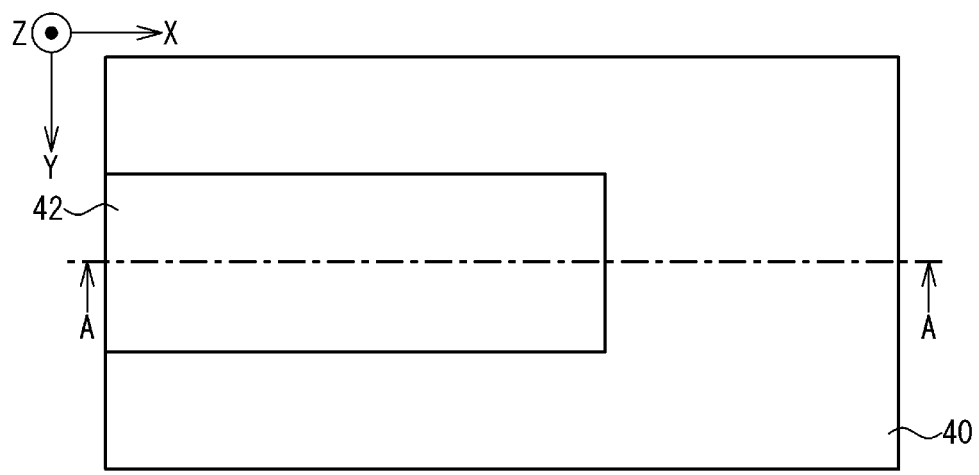
FIG. 3A is a plan view illustrating a method of manufacturing a semiconductor optical device.
Figure 3B:
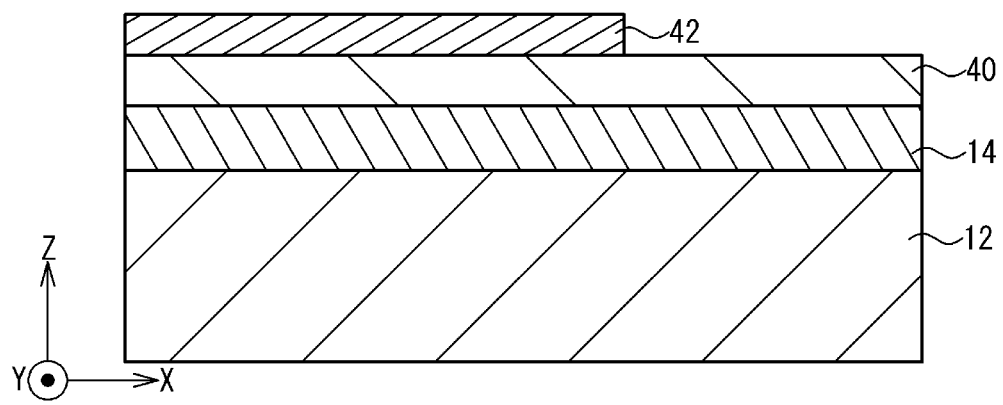
FIG. 3B is a cross-sectional view along line A-A of FIG. 3A.

As illustrated in FIGS. 3A and 3B, core layer 14 and a cap layer 40 are epitaxially grown in this order on substrate 12 by, for example, an organometallic vapor phase epitaxy (OMVPE) method. For example, an insulating film 42 is formed on a part of cap layer 40 by a plasma CVD (chemical vapor deposition) method or the like. The portion to be DFB region 10 is covered with insulating film 42, and the portion to be DBR region 30 is exposed. Cap layer 40 is formed of p-type InP (p-InP) having a thickness of 100 nm, for example. Insulating film 42 is formed of an insulator such as silicon oxide (SiO$_2$).

Figure 4A:
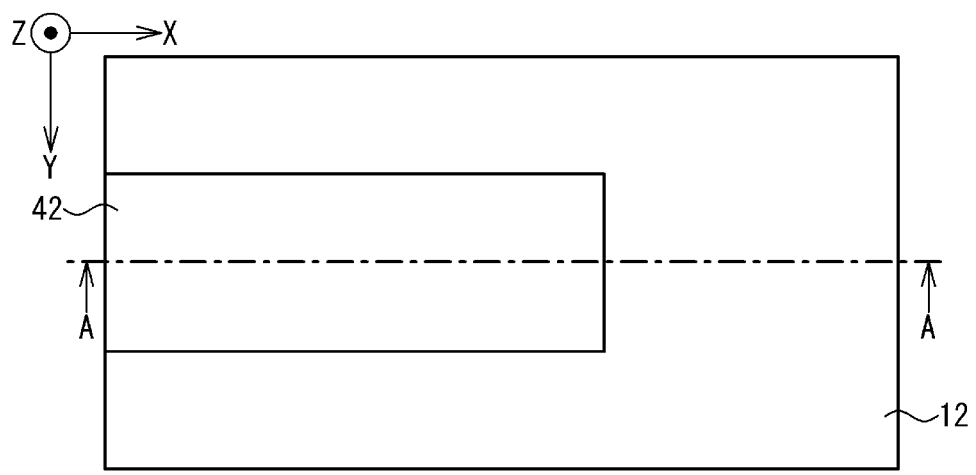
FIG. 4A is a plan view illustrating a method of manufacturing a semiconductor optical device.
Figure 4B:
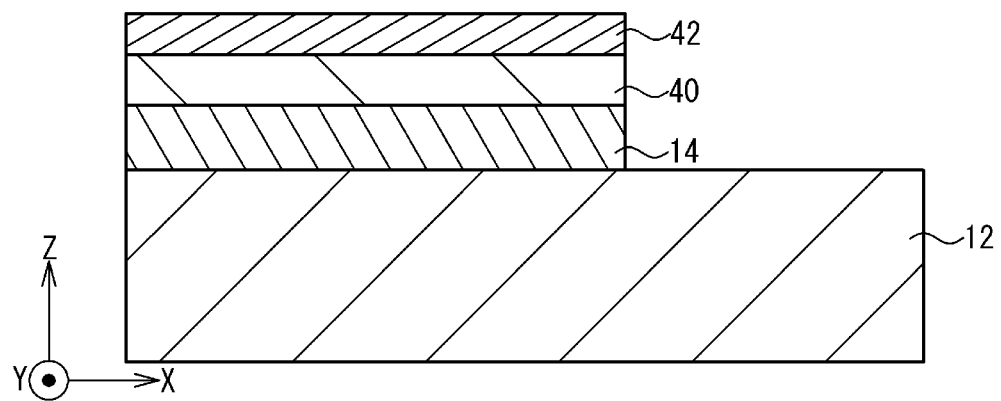
FIG. 4B is a cross-sectional view along line A-A of FIG. 4A.

As illustrated in FIGS. 4A and 4B, etching is performed using insulating film 42 as a mask to remove portions of cap layer 40 and core layer 14 exposed from insulating film 42. The etching is dry etching such as reactive ion etching (RIE) or wet etching. After the etching, substrate 12 is partially exposed. Portions of cap layer 40 and core layer 14 covered with insulating film 42 are not etched.

Figure 5A:
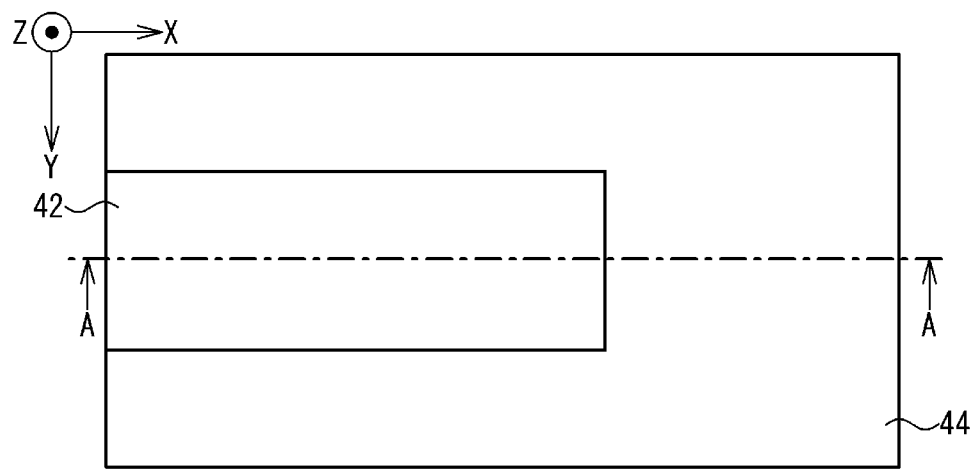
FIG. 5A is a plan view illustrating a method of manufacturing a semiconductor optical device.
Figure 5B:
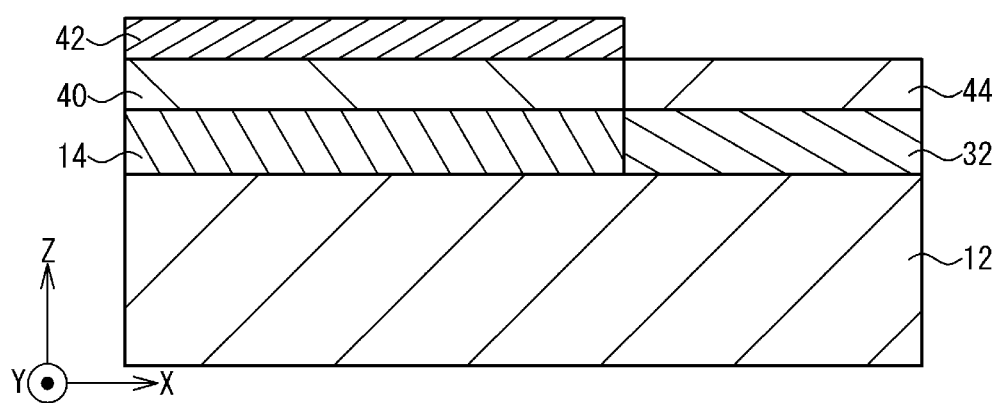
FIG. 5B is a cross-sectional view along line A-A of FIG. 5A.

As illustrated in FIGS. 5A and 5B, waveguide layer 32 and a p-InP cap layer 44 are epitaxially grown in this order on the portion of substrate 12 exposed from insulating film 42 by OMVPE or the like. The thickness of waveguide layer 32 may be equal to or different from the thickness of core layer 14. The thickness of cap layer 44 may be equal to or different from the thickness of cap layer 40. The thickness of waveguide layer 32 may be different from the thickness of core layer 14, and the thickness of cap layer 44 may be different from the thickness of cap layer 40, as long as there is no hindrance to the light traveling between DFB region 10 and DBR region 30. Cap layer 44 is exposed from insulating film 42.

Figure 6A:
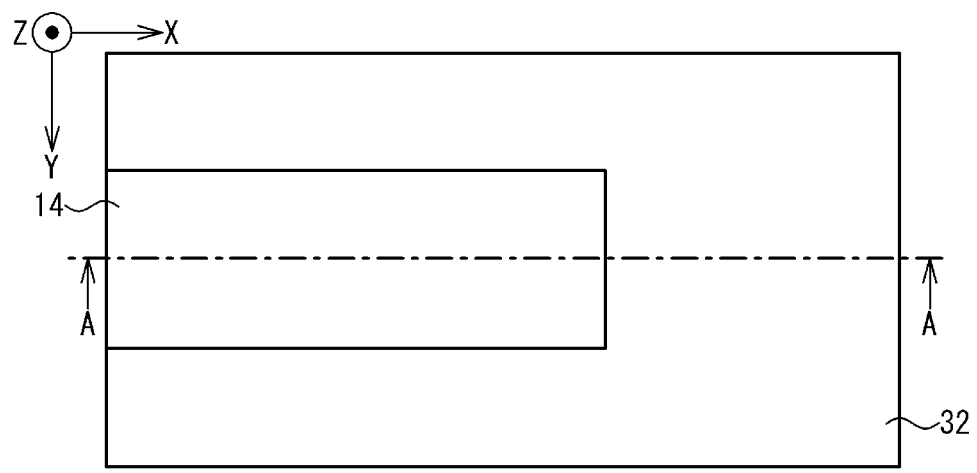
FIG. 6A is a plan view illustrating a method of manufacturing a semiconductor optical device.
Figure 6B:
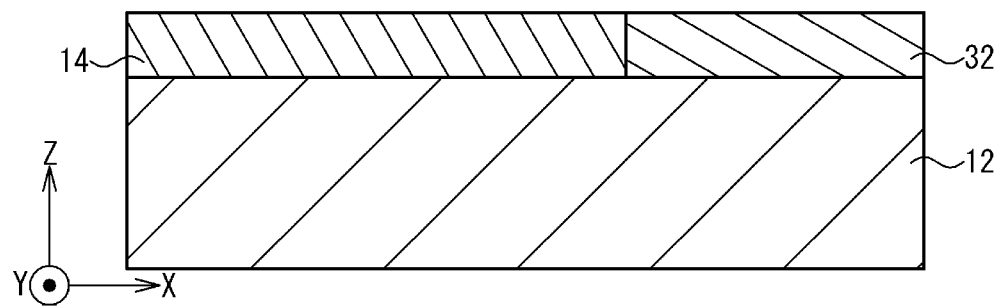
FIG. 6B is a cross-sectional view along line A-A of FIG. 6A.

As illustrated in FIGS. 6A and 6B, insulating film 42 is removed by dry etching using CF$_4$ (fluorocarbon) or wet etching using BHF (buffered hydrofluoric acid), and cap layers 40 and 44 are removed by etching. Core layer 14 and waveguide layer 32 are exposed.

Figure 7A:
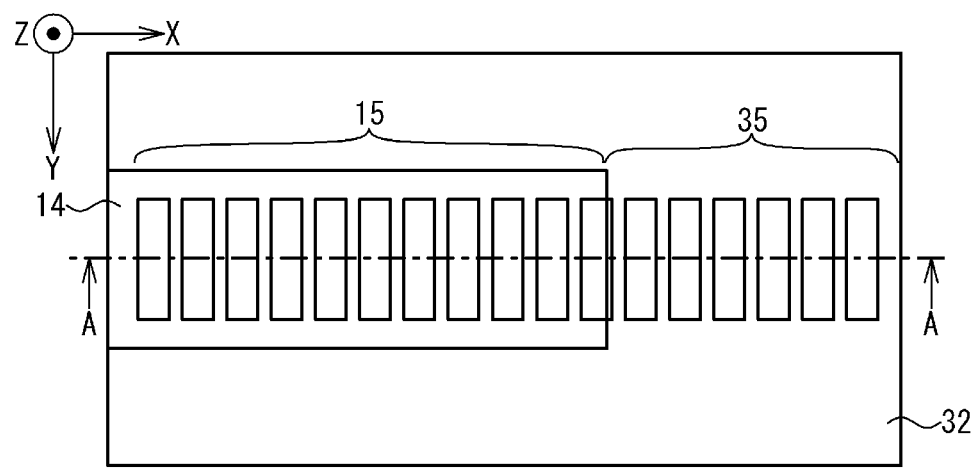
FIG. 7A is a plan view illustrating a method of manufacturing a semiconductor optical device.
Figure 7B:
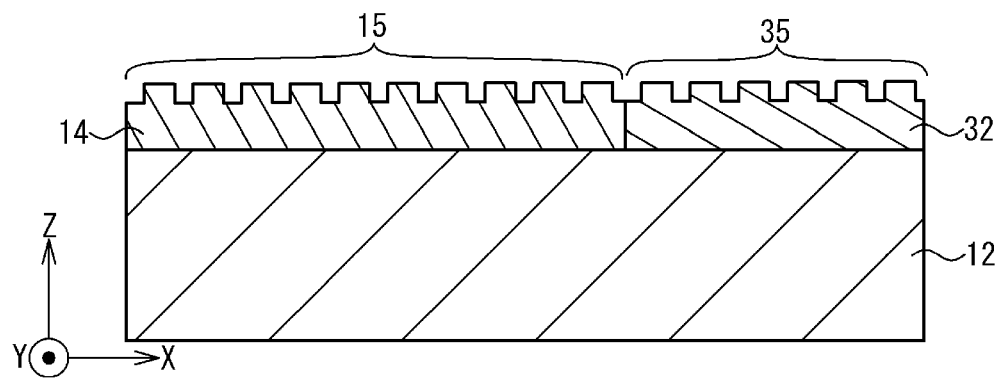
FIG. 7B is a cross-sectional view along line A-A of FIG. 7A.

As illustrated in FIGS. 7A and 7B, resist patterning is performed by electron beam lithography or the like, and wet etching is performed to form diffraction grating 15 on core layer 14 and diffraction grating 35 on waveguide layer 32. More specifically, core layer 14 and waveguide layer 32 are simultaneously subjected to the lithography and wet etching to form diffraction gratings 15 and 35 in a single step.

Figure 8A:
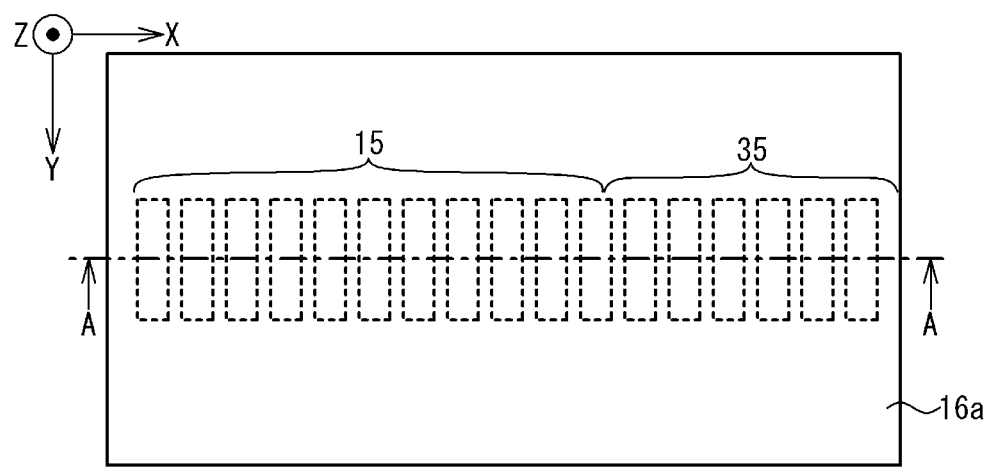
FIG. 8A is a plan view illustrating a method of manufacturing a semiconductor optical device.
Figure 8B:
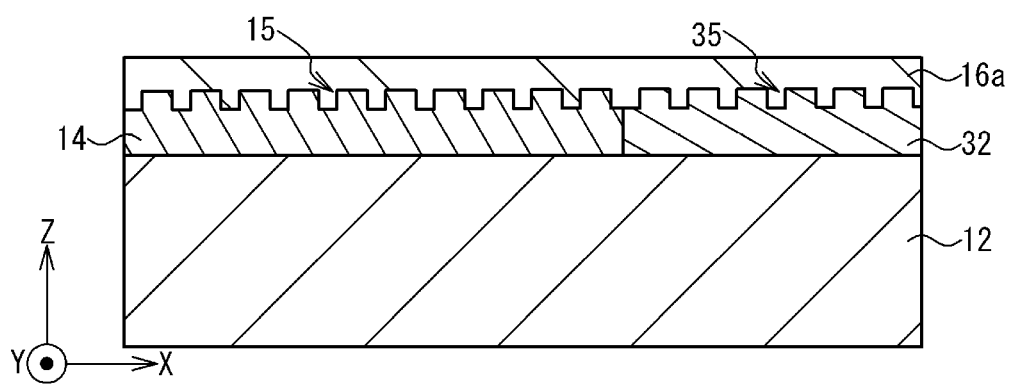
FIG. 8B is a cross-sectional view along line A-A of FIG. 8A.

As illustrated in FIGS. 8A and 8B, an embedding layer 16a of p-type InP is epitaxially grown on core layer 14 and waveguide layer 32 by the OMVPE method. Embedding layer 16a covers the entire core layer 14 and the entire waveguide layer 32, and embeds diffraction gratings 15 and 35.

Figure 9A:
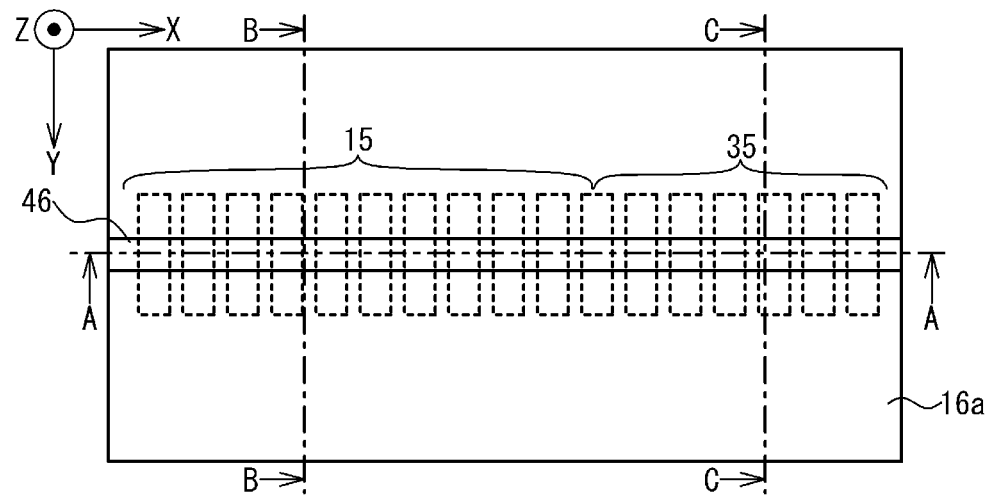
FIG. 9A is a plan view illustrating a method of manufacturing a semiconductor optical device.
Figure 9B:
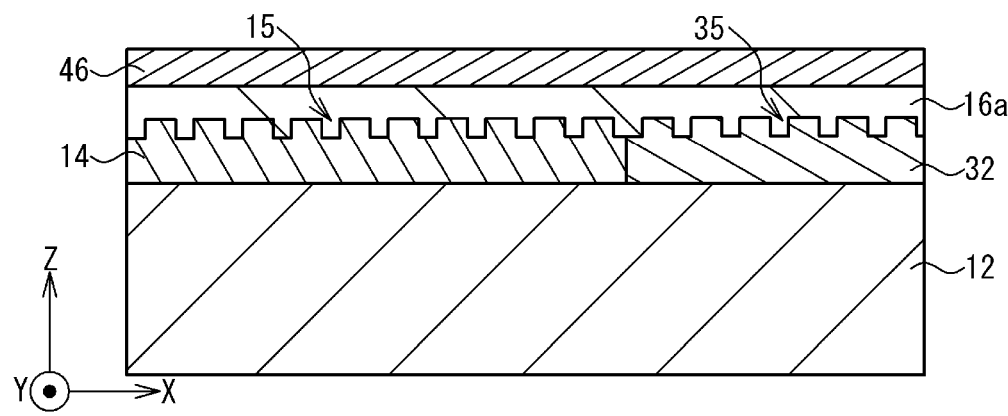
FIG. 9B is a cross-sectional view along line A-A of FIG. 9A.
Figure 10A:
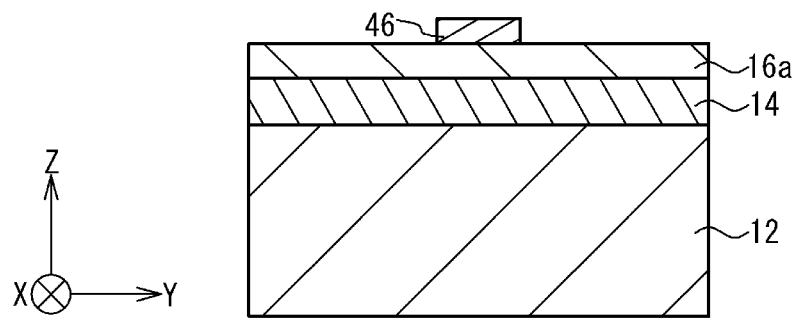
FIG. 10A is a cross-sectional view along line B-B of FIG. 9A.
Figure 10B:
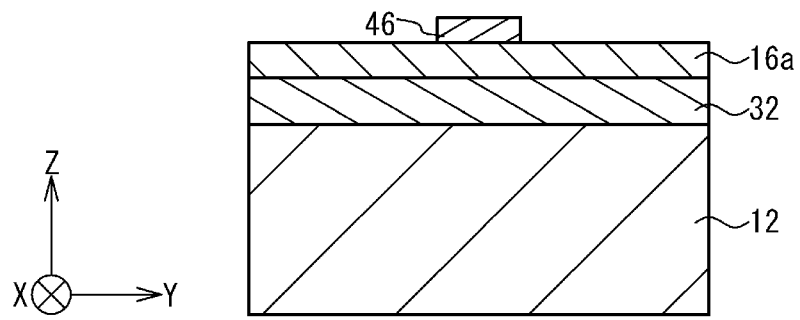
FIG. 10B is a cross-sectional view taken along line C-C of FIG. 9A.
Figure 11A:
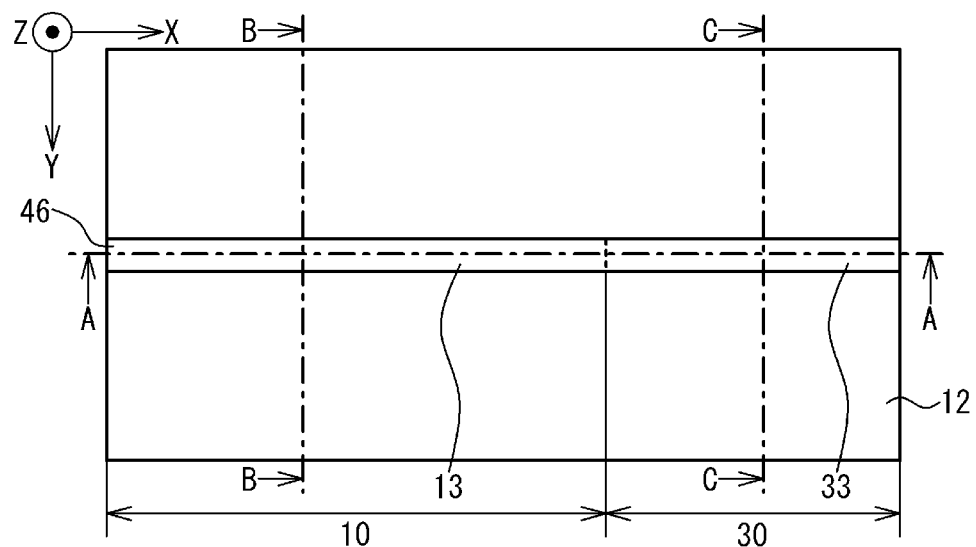
FIG. 11A is a plan view illustrating a method of manufacturing a semiconductor optical device.
Figure 11B:
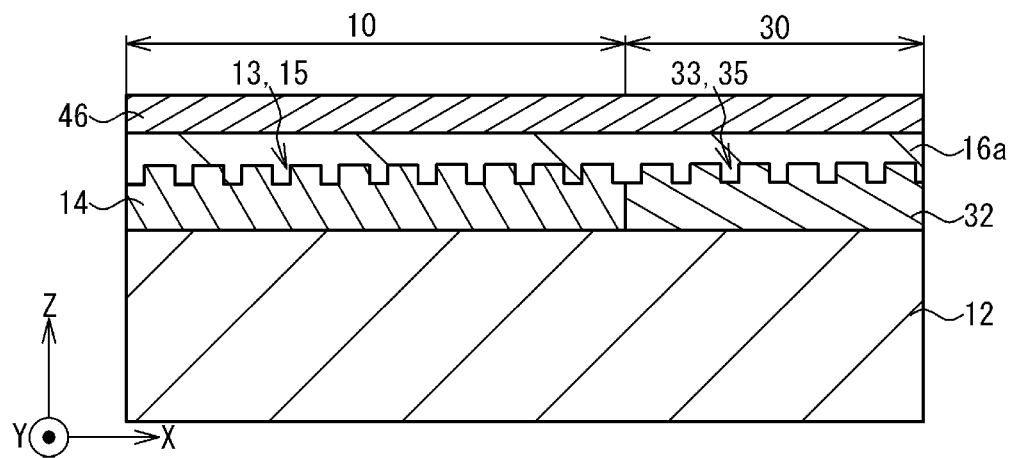
FIG. 11B is a cross-sectional view along line A-A of FIG. 11A.

As illustrated from FIG. 9A to FIG. 10B, an insulating film 46 of, for example, SiO$_2$ is provided on embedding layer 16a by a plasma CVD method or the like. As illustrated in FIGS. 9A and 9B, insulating film 46 extends in the X-axis direction. As illustrated in FIGS. 10A and 10B, the width of insulating film 46 in the Y-axis direction is smaller than the width of core layer 14 and the width of waveguide layer 32.

Figure 12A:
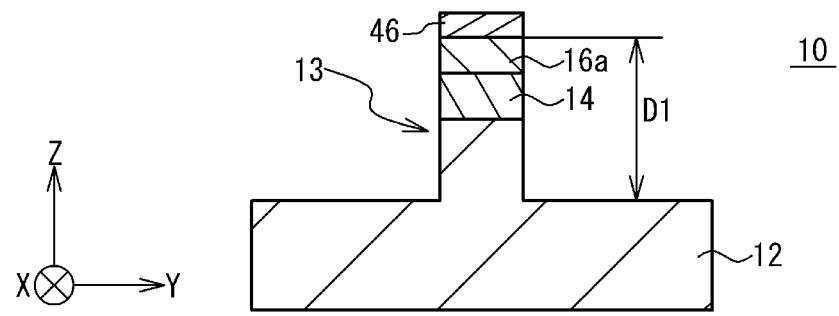
FIG. 12A is a cross-sectional view along line B-B of FIG. 11A.
Figure 12B:
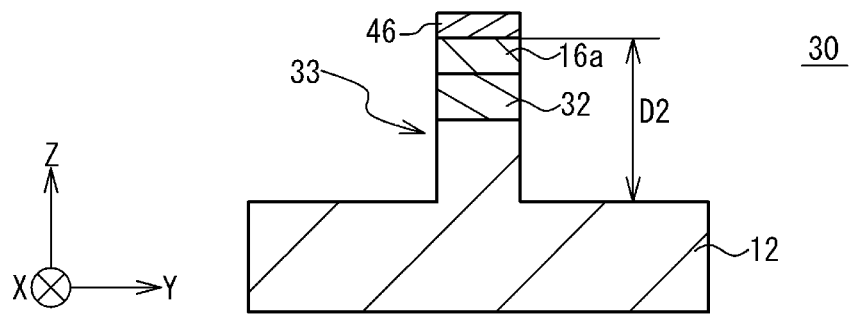
FIG. 12B is a cross-sectional view taken along line C-C of FIG. 11A.
Figure 13A:
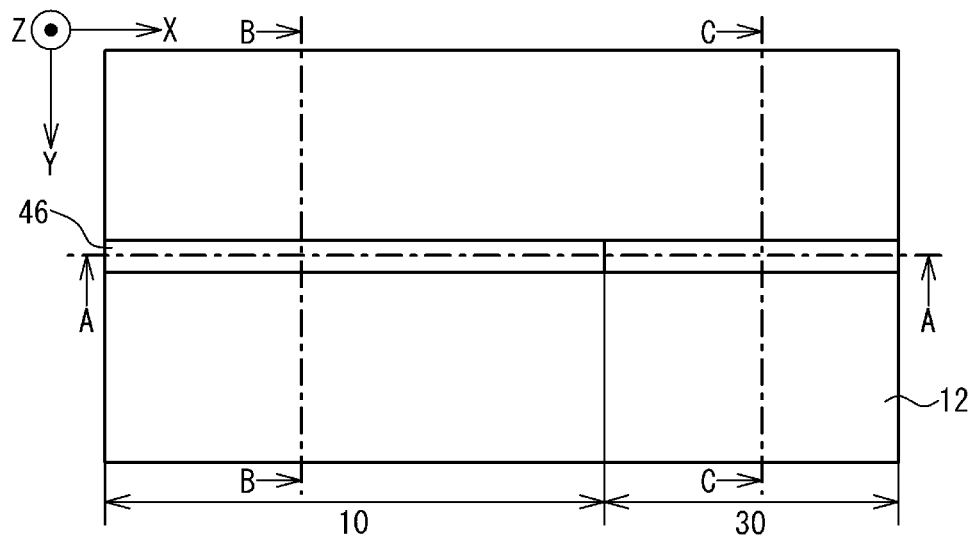
FIG. 13A is a plan view illustrating a method of manufacturing a semiconductor optical device.
Figure 13B:
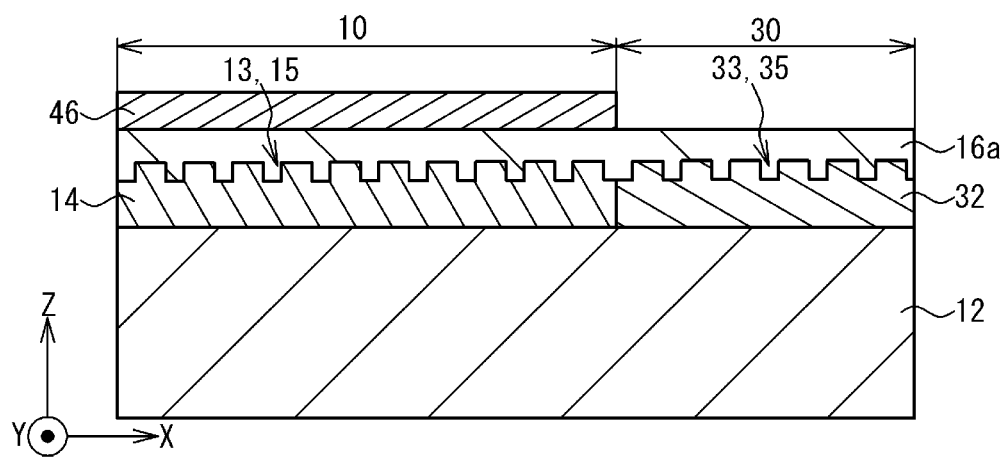
FIG. 13B is a cross-sectional view along line A-A of FIG. 13A.
Figure 14A:
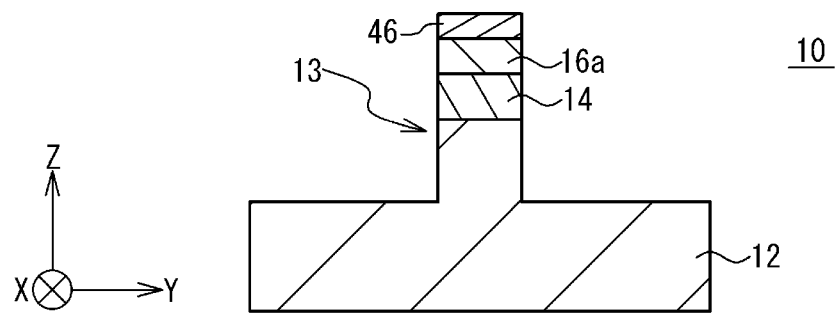
FIG. 14A is a cross-sectional view along line B-B of FIG. 13A.
Figure 14B:
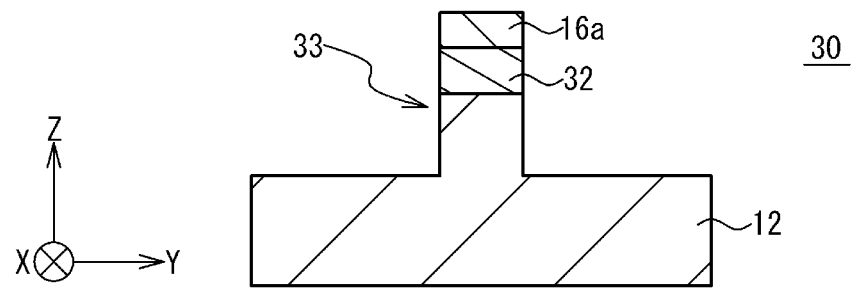
FIG. 14B is a cross-sectional view taken along line C-C of FIG. 13A.
Figure 15A:
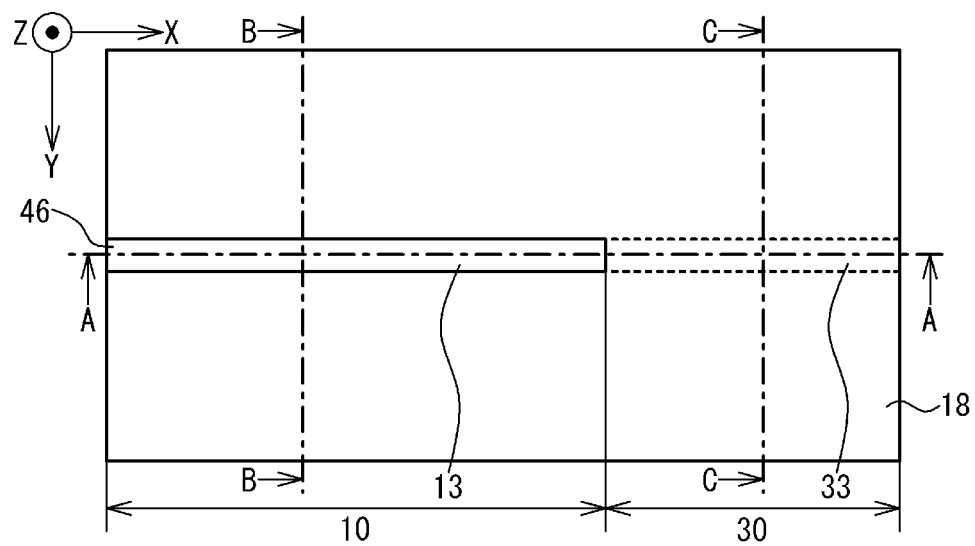
FIG. 15A is a plan view illustrating a method of manufacturing a semiconductor optical device.
Figure 15B:
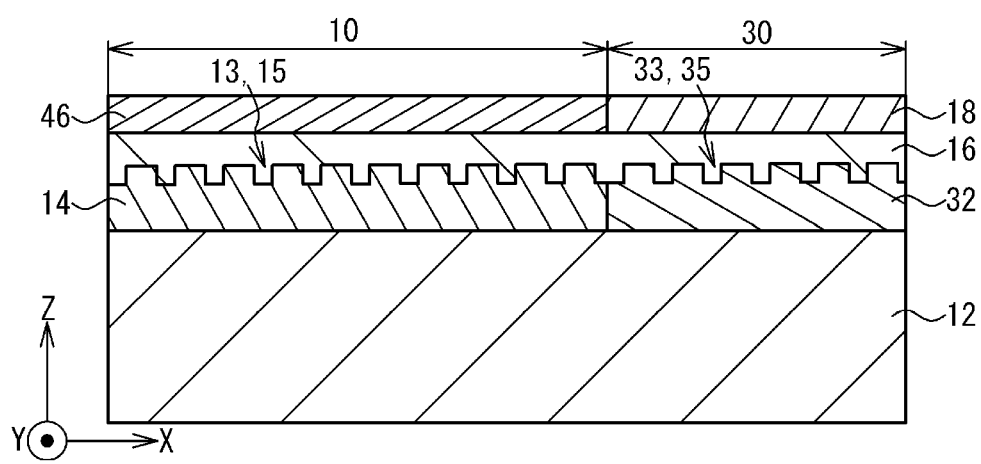
FIG. 15B is a cross-sectional view along line A-A of FIG. 15A.

As illustrated in FIGS. 11A to 12B, insulating film 46 is used as a mask to perform dry etching on substrate 12, core layer 14, and waveguide layer 32, thereby forming mesa 13 in DFB region 10 and forming mesa 33 in DBR region 30. A depth D1 of mesa 13 illustrated in FIG. 12A and a depth D2 of mesa 33 illustrated in FIG. 12B are each 1.5 μm, for example. Substrate 12 is exposed on the two sides of mesa 13 and the two sides of mesa 33.

As illustrated in FIGS. 13A to 14B, after mesas are formed, insulating film 46 on mesa 33 is removed and insulating film 46 on mesa 13 remains. An upper surface of mesa 33 is exposed.

Figure 16A:
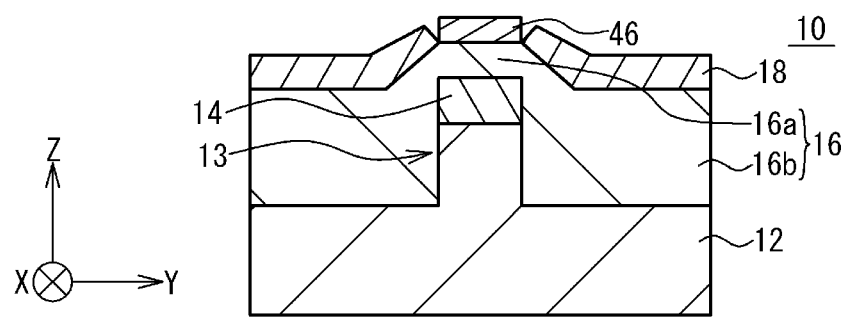
FIG. 16A is a cross-sectional view along line B-B of FIG. 15A.
Figure 16B:
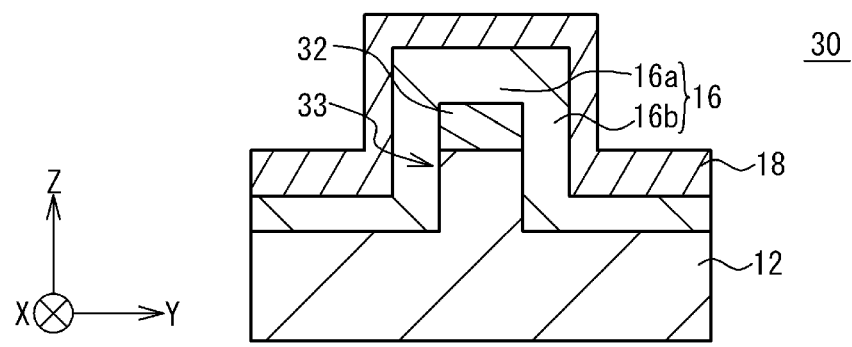
FIG. 16B is a cross-sectional view along line C-C of FIG. 15A.
Figure 17A:
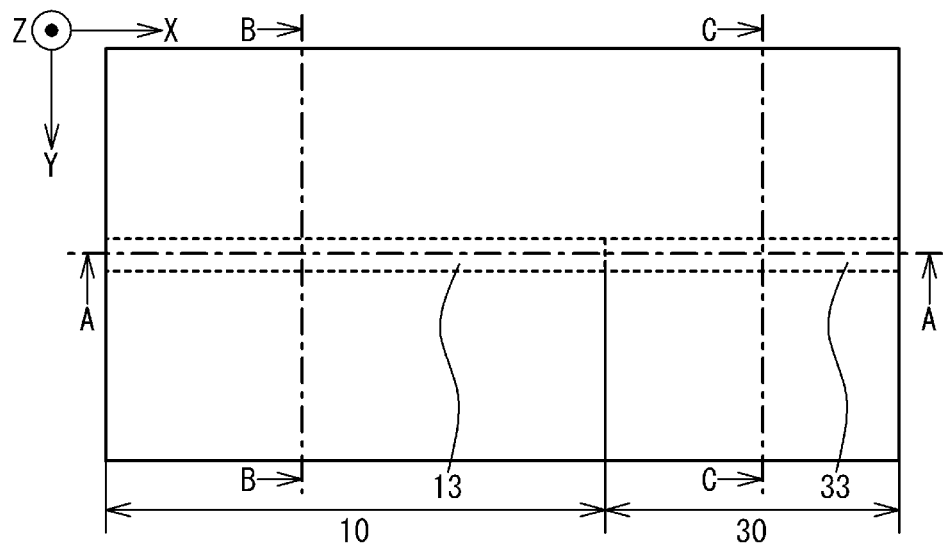
FIG. 17A is a plan view illustrating a method of manufacturing a semiconductor optical device.
Figure 17B:
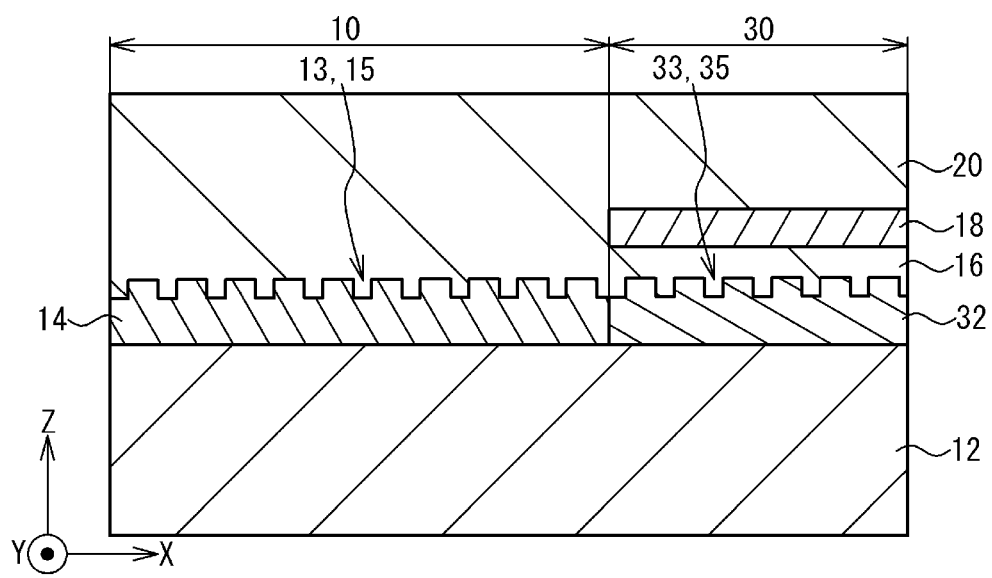
FIG. 17B is a cross-sectional view along line A-A of FIG. 17A.

As illustrated from FIG. 15A to FIG. 16B, the OMVPE method is performed using insulating film 46 as a mask to epitaxially grow an embedding layer 16b and embedding layer 18 in order. Embedding layer 16b is formed of, for example, p-type InP, and forms embedding layer 16 together with embedding layer 16a. After the p-type dopant is added to the source gas to grow embedding layer 16b, the dopant is changed to n-type one to grow embedding layer 18. As illustrated in FIG. 16A, since insulating film 46 is provided on mesa 13, embedding layer 16b and embedding layer 18 do not grow on mesa 13. Embedding layer 16b and embedding layer 18 grow on two sides of mesa 13 in the Y-axis direction. As illustrated in FIG. 16B, since mesa 33 is not covered with insulating film 46, embedding layer 16b and embedding layer 18 grow on mesa 33 and on the two sides of mesa 33. After the growth, insulating film 46 is removed.

Figure 18A:
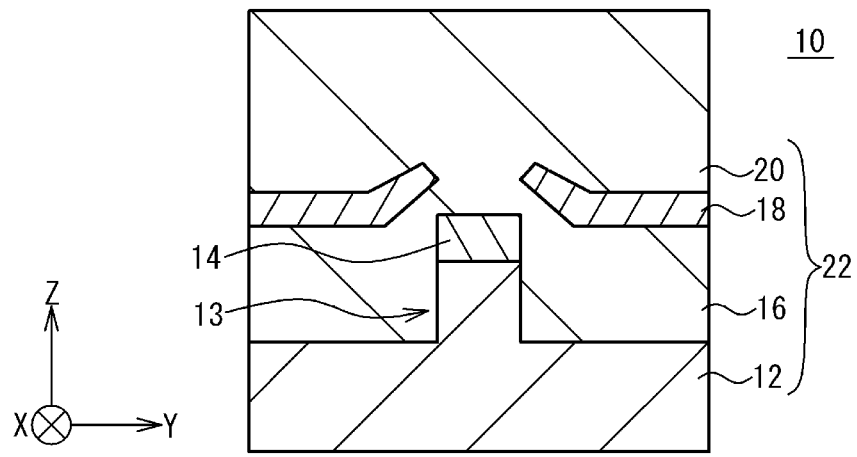
FIG. 18A is a cross-sectional view along line B-B of FIG. 17A.
Figure 18B:
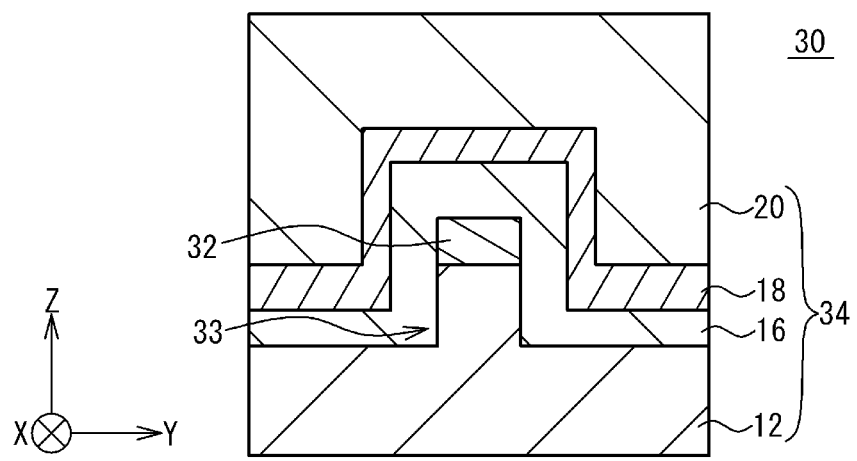
FIG. 18B is a cross-sectional view along line C-C of FIG. 17A.
Figure 19A:
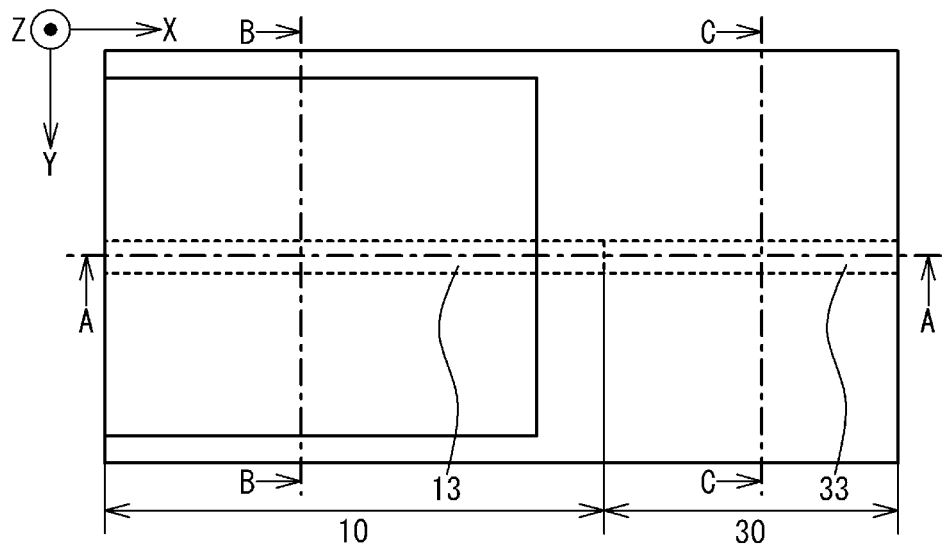
FIG. 19A is a plan view illustrating a method of manufacturing a semiconductor optical device.
Figure 19B:
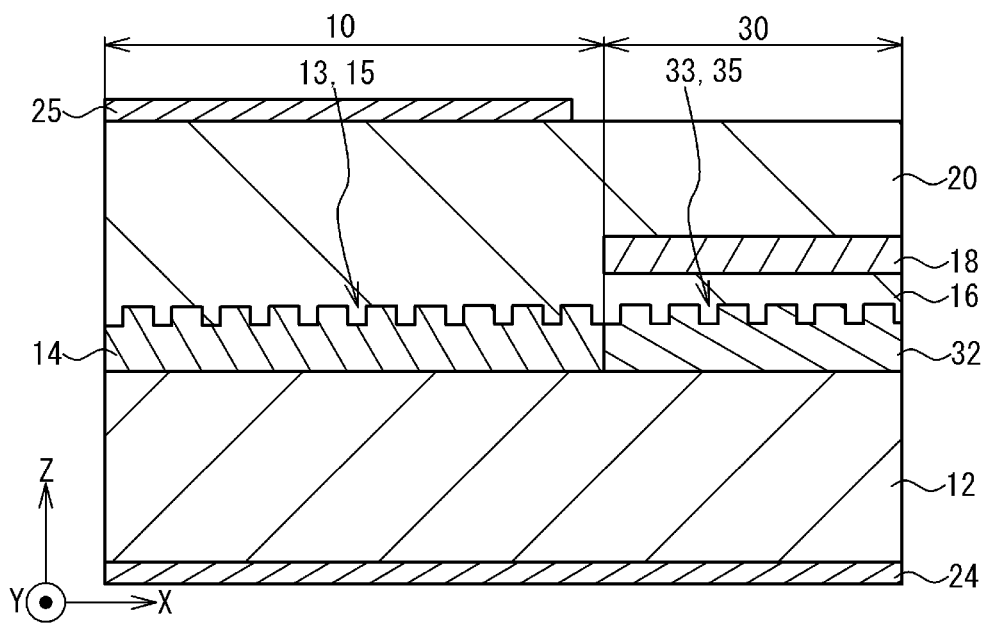
FIG. 19B is a cross-sectional view line A-A of FIG. 19A.
Figure 20A:
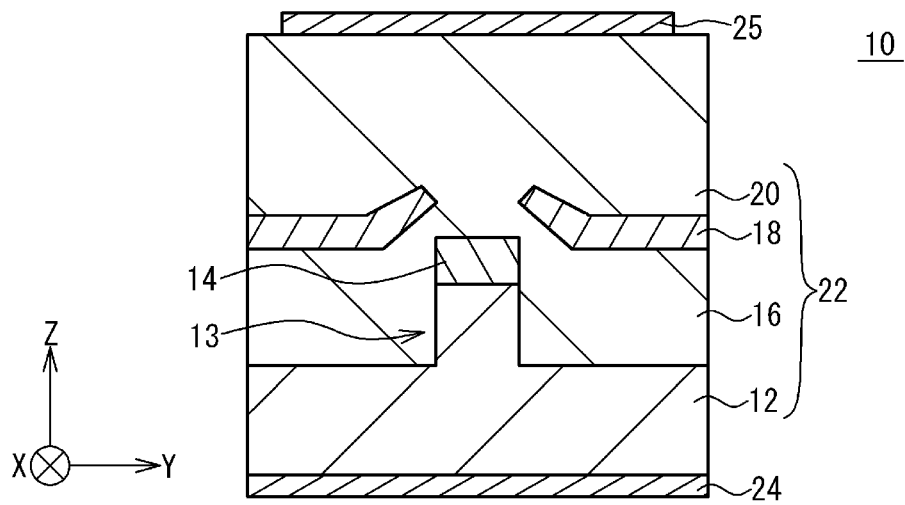
FIG. 20A is a cross-sectional view along line B-B of FIG. 19A.
Figure 20B:
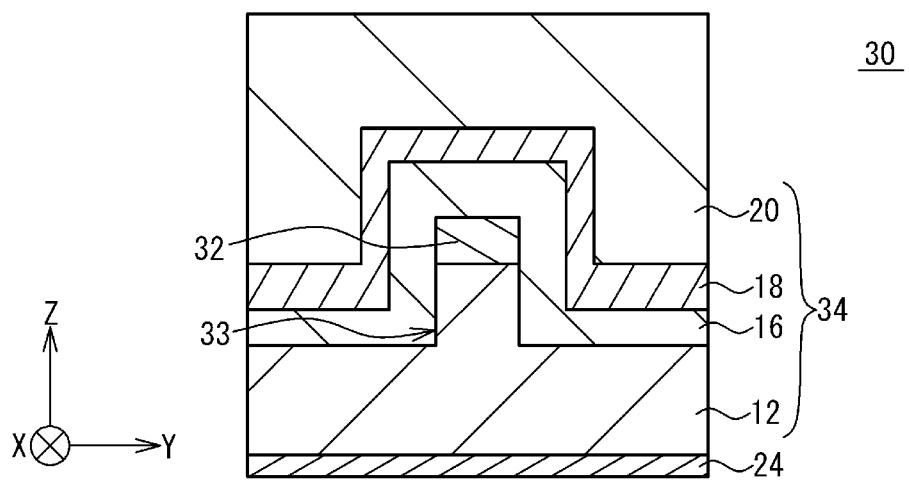
FIG. 20B is a cross-sectional view taken along line C-C of FIG. 19A.

As illustrated in FIGS. 17A to 18B, cladding layer 20 is epitaxially grown by OMVPE or the like. As illustrated in FIG. 18A, cladding layer 20 is formed over embedding layers 16 and 18 and contacts embedding layer 16 between the two embedding layers 18. Substrate 12, embedding layer 16, embedding layer 18 and cladding layer 20 form thyristor 22 on two sides of mesa 13. As illustrated in FIG. 18B, cladding layer 20 covers embedding layer 18. Substrate 12, embedding layer 16, embedding layer 18, and cladding layer 20 form thyristor 34 at an overlap position with mesa 33 and two sides of mesa 33.

As illustrated in FIGS. 19A to 20A, electrode 25 is provided on the upper surface of cladding layer 20 of DFB region 10 by, for example, vapor deposition. Electrode 25 is not provided in DBR region 30. As illustrated in FIGS. 19B to 20B, electrode 24 is provided on the lower surface of substrate 12 by, for example, vapor deposition. Semiconductor optical device 100 is manufactured by above-described steps.

Comparative Example 1

Figure 21A:
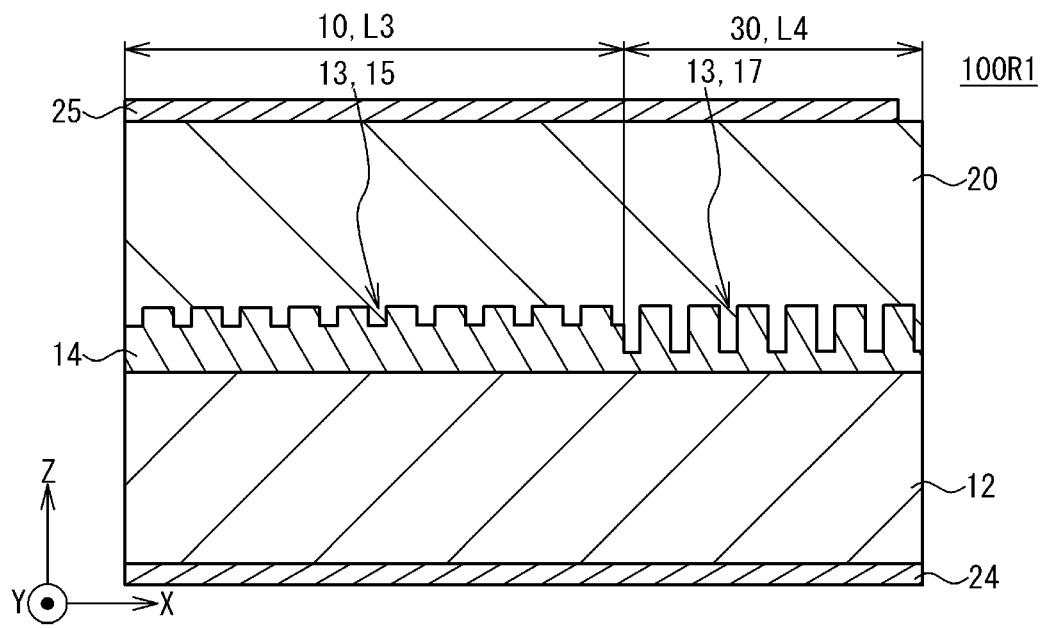
FIG. 21A is a cross-sectional view illustrating a semiconductor optical device according to Comparative Example 1.
Figure 21B:
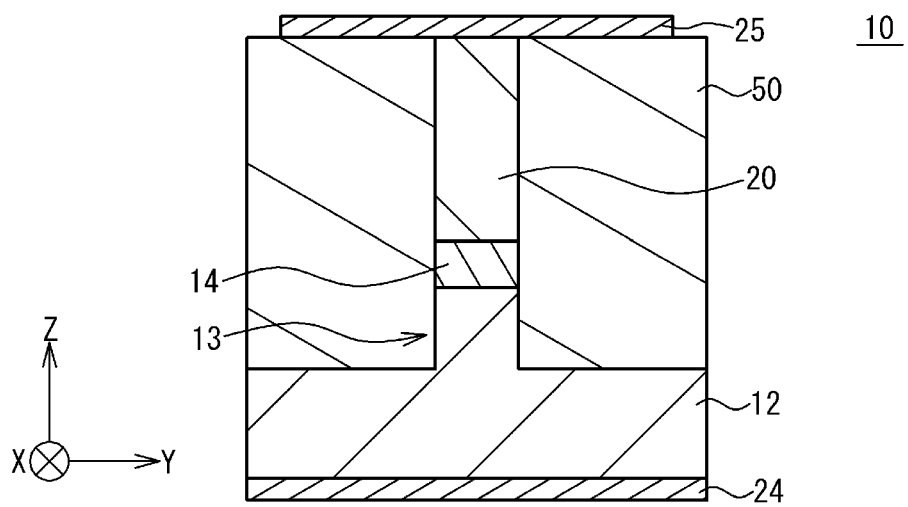
FIG. 21B is a cross-sectional view illustrating a semiconductor optical device according to Comparative Example 1.

FIGS. 21A and 21B are cross-sectional views illustrating a semiconductor optical device 100R1 according to Comparative Example 1. FIG. 21A illustrates a cross-section corresponding to FIG. 1B, and FIG. 21B illustrates a cross-section corresponding to FIG. 2A.

As illustrated in FIG. 21A, semiconductor optical device 100R1 does not have waveguide layer 32. Core layer 14 is provided in DFB region 10 and DBR region 30. Mesa 13 includes core layer 14 and extends in DFB region 10 and DBR region 30. Diffraction grating 15 is provided in core layer 14 of DFB region 10. A diffraction grating 17 is provided in core layer 14 of DBR region 30. The depth of diffraction grating 17 is larger than that of diffraction grating 15. The coupling coefficient of diffraction grating 15 is, for example, 50 $cm^{-1}$. The coupling coefficient of diffraction grating 17 is, for example, 100 $cm^{-1}$. A length L3 of DFB region 10 is, for example, 500 µm. A length L4 of DBR region 30 is, for example, 100 µm. The light reflectance of DBR region 30 is, for example, 60%. Electrodes 24 and 25 are provided in DFB region 10 and DBR region 30.

FIG. 21B illustrates DFB region 10. Cladding layer 20 having the same width as core layer 14 is provided on core layer 14. An embedding layer 50 is located on two sides of mesa 13 and is provided in DFB region 10 and DBR region 30. Embedding layer 50 is formed of, for example, semi-insulating InP doped with iron (Fe). Embedding layers 16 and 18 are not provided.

By applying a voltage to electrodes 24 and 25, a current is injected into core layer 14. Cladding layer 20 serves as a current path. However, a current may leak from cladding layer 20 to embedding layer 50 and flow toward substrate 12. Since the current leaking to embedding layer 50 does not contribute to the optical output, the energy efficiency decreases and it becomes difficult to obtain a high optical output. Cladding layer 20, which provides the current path, is narrower and has a higher electrical resistance than in the example of FIG. 2A. Cladding layer 20 is likely to generate heat by the current flow. In particular, a high output operation at a high temperature generates a large amount of heat, which may cause deterioration of characteristics such as a decrease in output. When the drive current is 400 mA, the output at room temperature (25° C.) is 60 mW. The output at 85° C. is 20 mW and drops to about 30% of the output at room temperature.

As illustrated in FIG. 21A, since core layer 14 and electrodes 24 and 25 are provided in DBR region 30, current is also injected into core layer 14 of DBR region 30. Since current is injected into DBR region 30 having poor optical gain, energy efficiency is reduced. For example, about 20% of the current input to semiconductor optical device 100R1 is input to DBR region 30 and does not contribute to the optical output.

In order to form diffraction gratings 15 and 17 having different depths illustrated in FIG. 21A, core layer 14 is subjected to electron beam lithography and etching twice. In such a process, dimensional and positional deviations may occur and yield may decrease.

Comparative Example 2

Figure 22A:
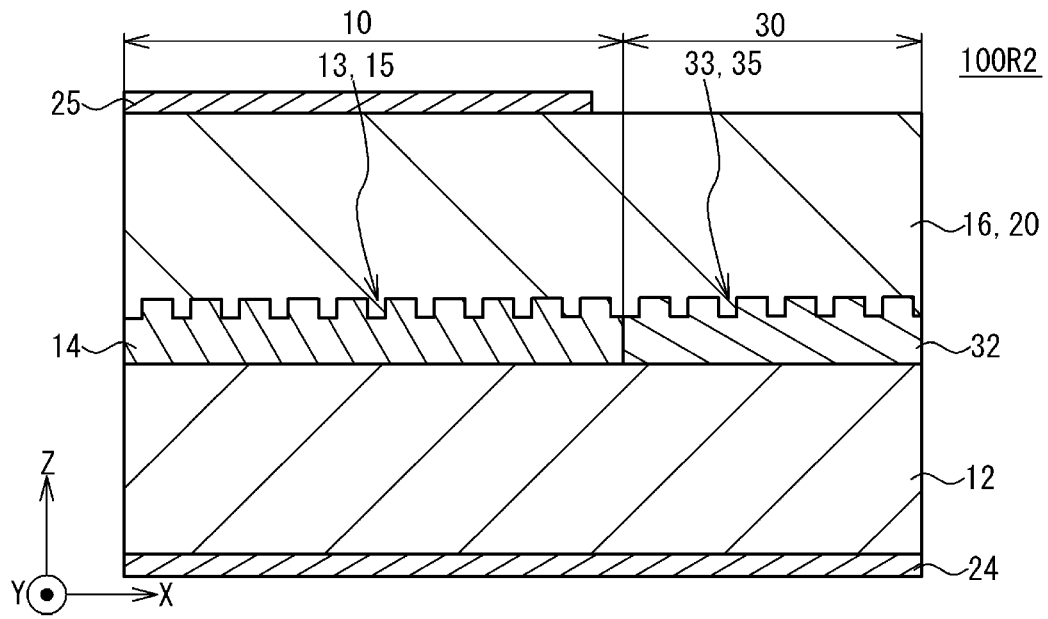
FIG. 22A is a cross-sectional view illustrating a semiconductor optical device according to Comparative Example 2.
Figure 22B:
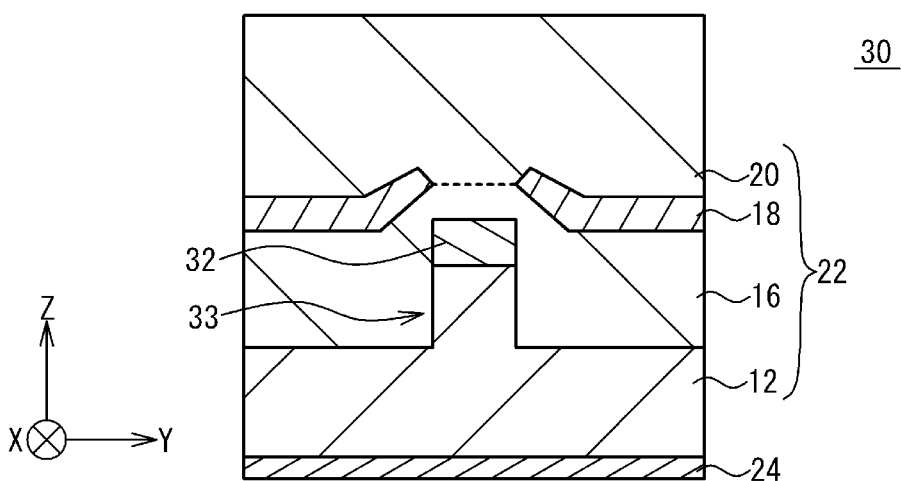
FIG. 22B is a cross-sectional view illustrating semiconductor optical device according to Comparative Example 2.

FIGS. 22A and 22B are cross-sectional views illustrating a semiconductor optical device 100R2 according to Comparative Example 2. FIG. 22A illustrates a cross-section corresponding to FIG. 1B, and FIG. 22B illustrates a cross-section corresponding to FIG. 2B. The structure of DFB region 10 is the same as that illustrated in FIG. 2A.

As illustrated in FIGS. 22A and 22B, waveguide layer 32 is provided in DBR region 30. As illustrated in FIG. 22B, embedding layers 16 and 18 are provided on two sides of mesa 33. Embedding layer 18 is not located directly above mesa 33. Cladding layer 20 is provided on mesa 33 and embedding layer 18. Substrate 12, embedding layers 16 and 18, and cladding layer 20 form thyristor 22 on two sides of mesas 13 and 33. Thyristor 22 is not formed at an overlap position with mesa 33.

Since thyristor 22 is formed on the two sides of mesa 13, current leakage to embedding layer can be suppressed, and current can be selectively injected into core layer 14 of DFB region 10. Since cladding layer 20 has a larger width than that of Comparative Example 1, cladding layer 20 hardly generates heat.

However, each of embedding layers 16 and 18 and cladding layer 20 is electrically connected from DFB region 10 to DBR region 30 in the X-axis direction. As illustrated in FIG. 22B, thyristor 22 is not formed in an overlap position with mesa 33. Cladding layer 20, waveguide layer 32 and substrate 12 form a p-i-n structure in the Z-axis direction. The current leaks from DFB region 10 to DBR region 30 through embedding layer 18 and the like, and also flows to waveguide layer 32. Carriers are accumulated in waveguide layer 32 due to the leakage of current, and the refractive index of waveguide layer 32 changes. Due to the change in the refractive index, the wavelength (reflection wavelength) at which DBR region 30 exhibits high reflectance changes, and deviates from the oscillation wavelength of DFB region 10. Since DBR region 30 does not exhibit a desired reflection function, the characteristics of semiconductor optical device 100R2 deteriorate.

According to the present embodiment, as illustrated in FIG. 2B, n-type substrate 12, p-type embedding layer 16, n-type embedding layer 18, and p-type cladding layer 20 form thyristor 34 at an overlap position with mesa 33 and two sides of mesa 33 in the Z-axis direction in DBR region 30. Since thyristor 34 which has n-p-n-p lamination structure enabling high resistance is provided, it is difficult for current to flow through DBR region 30, and leakage of current from DFB region 10 to DBR region 30 is suppressed. By suppressing the current loss, the energy efficiency of semiconductor optical device 100 is increased. Since thyristor 34 overlaps waveguide layer 32 in the Z-axis direction, a current hardly flows through waveguide layer 32, and accumulation of carriers in waveguide layer 32 is suppressed. The reflection wavelength of DBR region 30 hardly deviates from the oscillation wavelength of DFB region 10. The light emitted from DFB region 10 is reflected by DBR region 30, returns to DFB region 10, and is emitted to the outside of semiconductor optical device 100. Semiconductor optical device 100 can exhibit desired characteristics.

As illustrated in FIG. 2A, substrate 12, embedding layers 16 and 18, and cladding layer 20 form thyristor 22 on two sides of mesa 13 of DFB region 10. Leakage of current to embedding layers 16 and 18 is suppressed. Since the current is selectively injected into mesa 13, the energy efficiency of semiconductor optical device 100 is increased. Since cladding layer 20 has a greater width than in the example of FIG. 21B, the electrical resistance of cladding layer 20 is lower. By the reduction of the electric resistance of cladding layer 20, heat generation when a current flows is suppressed, and deterioration of characteristics is suppressed. As will be described later, deterioration of characteristics particularly during high-temperature high-output operation is suppressed.

As illustrated in FIG. 1B, electrodes 24 and 25 are provided in DFB region 10, and a current is input through these electrodes. On the other hand, at least one of electrodes 24 and 25 is not provided in DBR region 30. In the example of FIG. 1B, electrode 25 is not provided, and no current is injected into DBR region 30. Therefore, current loss is suppressed, and the energy efficiency of semiconductor optical device 100 is increased.

According to the present embodiment, the energy efficiency is improved by 30% to 40% at room temperature and is improved by about two times at a high temperature (85° C.) as compared with Comparative Example 1. For example, when the drive current is 400 mA, the output at room temperature is 100 mW. The output at 85° C. is 50 mW and maintains 50% of the output at room temperature. Semiconductor optical device 100 has high energy efficiency and is particularly suitable for high-temperature and high-power operation.

Instead of DBR region 30, a high-reflection film may be attached to DFB region 10 reflect light to DFB region 10. Since the high reflection film is provided at the cleavage position of the wafer, the phase of the reflected light is determined according to the cleavage position. Since it is difficult to control the cleavage position, the phase of the reflected light changes for each element. The sub-mode suppression ratio (SMSR) varies from device to device, and the yield decreases. Semiconductor optical device 100R1 of Comparative Example 1 is an element having a butt joint structure without using a high reflection film. However, since diffraction grating 15 and diffraction grating 17 are formed in different processes, a positional or the like may occur. To solve the problem that the phase of light is not as designed and the yield is reduced.

On the other hand, semiconductor optical device 100 is a DR laser element having a butt joint structure including DFB region 10 and DBR region 30. As illustrated in FIG. 1B, mesa 13 and diffraction grating 15 are provided in DFB region 10. Mesa 33 and diffraction grating 35 are provided in DBR region 30. DFB region 10 and DBR region 30 are designed in consideration of the phase of light. Diffraction grating 15 and diffraction grating 35 have the same shape. That is, the pitch of diffraction grating 15 is the same as the pitch of diffraction grating 35. The depth of diffraction grating 15 is equal to the depth of diffraction grating 35. As illustrated in FIGS. 7A and 7B, diffraction grating 15 and diffraction grating 35 can be collectively formed by the same electron beam drawing and the same etching. Positional deviation or the like is suppressed, and SMSR and yield are improved. The yield is, for example, twice that of Comparative Example 1.

Diffraction grating 15 may be provided in core layer 14 or another layer. Diffraction grating 35 may be provided in waveguide layer 32 or in another layer. This embodiment may be applied to devices other than the devices illustrated in FIGS. 1A and 1B. In a butt joint structure integrating a light emitting region having core layer and a reflecting region having waveguide layer, thyristor is provided so as to include waveguide layer of the reflecting region. Leakage of current to the reflecting region can be suppressed.

Substrate 12 and embedding layer 18 are formed of n-InP. Embedding layer 16 and cladding layer 20 are formed of p-InP. A layer can be grown by an OMVPE method by using the same source gas and switching between a p-type dopant and an n-type dopant. Substrate 12, embedding layers 16 and 18, and cladding layer 20 may be formed of a compound semiconductor other than InP. A p-type layer, an n-type layer, a p-type layer, and an n-type layer may be stacked, p-type, and n-type layers may be stacked from the bottom. Since the band gap of waveguide layer 32 is larger than the energy of light, absorption of light by waveguide layer 32 is suppressed.

Although the embodiments of the present disclosure have been described in detail above, the present disclosure is not limited to the specific embodiments, and various modifications and changes can be made within the scope of the gist of the present disclosure described in the claims.

What is claimed is:

1. A semiconductor optical device in which a light emitting region that emits light and a reflecting region that reflects the light to the light emitting region side are integrated, the semiconductor optical device comprising:
   a core layer that is provided in the light emitting region;
   a waveguide layer that is provided in the reflecting region, that is optically coupled to the core layer, and that has a band gap that is larger than energy of the light;
   a first semiconductor layer of a first conductivity type that is provided below the core layer and the waveguide layer;
   a second semiconductor layer of a second conductivity type that is provided on the waveguide layer, the second conductivity type differing from the first conductivity type;

a third semiconductor layer of the first conductivity type that is provided on the second semiconductor layer;

a fourth semiconductor layer of the second conductivity type that is provided on the core layer and above the second semiconductor layer; and a first thyristor in the reflecting region that overlaps the waveguide layer in a first direction that is a direction that intersects a propagation direction of the light, wherein the first semiconductor layer and the core layer form a first mesa that protrudes in the first direction, the first semiconductor layer and the waveguide layer form a second mesa that protrudes in the first direction, the first mesa and the second mesa extend in the propagation direction of the light and are adjacent to each other, the first thyristor is formed at a position that overlaps the second mesa in the first direction, and on two sides of the second mesa, in the reflecting region, the second semiconductor layer and the third semiconductor layer are each provided on the two sides of the second mesa and above the second mesa, the fourth semiconductor layer is provided on the third semiconductor layer so as to cover an upper side of the second mesa and the two sides of the second mesa, and the first semiconductor layer, the second semiconductor layer, the third semiconductor layer, and the fourth semiconductor layer form the first thyristor at the position that overlaps the second mesa, and on the two sides of the second mesa.

2. The semiconductor optical device according to claim 1, wherein in the light emitting region, the second semiconductor layer and the third semiconductor layer are each provided on two sides of the first mesa, the fourth semiconductor layer is provided on the third semiconductor layer and above the first mesa, and the first semiconductor layer, the second semiconductor layer, the third semiconductor layer, and the fourth semiconductor layer form a second thyristor on the two sides of the first mesa.

3. The semiconductor optical device according to claim 1, wherein the first mesa has a first diffraction grating, the second mesa has a second diffraction grating, and a shape of the first diffraction grating is the same as a shape of the second diffraction grating.

4. The semiconductor optical device according to claim 1, wherein a first electrode and a second electrode are provided at the light emitting region, and at least one of the first electrode and the second electrode is not provided at the reflecting region.

5. The semiconductor optical device according to claim 1, wherein the first semiconductor layer and the third semiconductor layer each include n-type indium phosphide, and the second semiconductor layer and the fourth semiconductor layer each include p-type indium phosphide.

6. A method of manufacturing a semiconductor optical device in which a light emitting region that emits light and a reflecting region that reflects the light to the light emitting region side are integrated, the method comprising:

growing, on a first semiconductor layer of a first conductivity type, a core layer in the light emitting region;

growing, on the first semiconductor layer in the reflecting region, a waveguide layer that is optically coupled to the core layer and that has a band gap that is larger than energy of the light;

forming, in the reflecting region, a first thyristor that overlaps the waveguide layer in a first direction that is a direction that intersects a propagation direction of the light;

growing, on the waveguide layer, a first embedding layer of a second conductivity type, the second conductivity type differing from the first conductivity type;

etching the first semiconductor layer and the core layer to form a first mesa that protrudes in the first direction;

etching the first semiconductor layer and the waveguide layer to form a second mesa that protrudes in the first direction;

growing, on the waveguide layer, a second embedding layer of the second conductivity type, and forming a second semiconductor layer with the first embedding layer and the second embedding layer;

changing a dopant from the second conductivity type to the first conductivity type and a third semiconductor layer of the first conductivity type on the second semiconductor layer;

growing a fourth semiconductor layer of the second conductivity type on the core layer and above the second semiconductor layer; and forming, a first thyristor that overlaps the waveguide layer in the first direction, using the first semiconductor layer, the second semiconductor layer, the third semiconductor layer, and the fourth semiconductor layer in the reflecting region at a position that overlaps the second mesa in the first direction, and on two sides of the second mesa, wherein the first mesa and the second mesa extend in the propagation direction of the light and are adjacent to each other, in the reflecting region, the second semiconductor layer and the third semiconductor layer are each provided on the two sides of the second mesa and above the second mesa, and the fourth semiconductor layer is provided on the third semiconductor layer so as to cover an upper side of the second mesa and the two sides of the second mesa.

7. The method of manufacturing the semiconductor optical device according to claim 6, comprising:

etching the core layer and the waveguide layer to form a first diffraction grating in the core layer and a second diffraction grating in the waveguide layer, the second diffraction grating being adjacent to the first diffraction grating.

8. A semiconductor optical device in which a light emitting region that emits light and a reflecting region that reflects the light to the light emitting region side are integrated, the semiconductor optical device comprising:

a core layer that is provided in the light emitting region;

a waveguide layer that is provided in the reflecting region, that is optically coupled to the core layer, and that has a band gap that is larger than energy of the light;

a first semiconductor layer of a first conductivity type that is provided below the core layer and the waveguide layer;

a second semiconductor layer of a second conductivity type that is provided on the waveguide layer, the second conductivity type differing from the first conductivity type;
a third semiconductor layer of the first conductivity type that is provided on the second semiconductor layer;
a fourth semiconductor layer of the second conductivity type that is provided on the core layer and above the second semiconductor layer; and
a first thyristor in the reflecting region that overlaps the waveguide layer in a first direction that is a direction that intersects a propagation direction of the light, wherein
the first semiconductor layer and the core layer form a first mesa that protrudes in the first direction,
the first semiconductor layer and the waveguide layer form a second mesa that protrudes in the first direction,
the first mesa and the second mesa extend in the propagation direction of the light and are adjacent to each other,
the first thyristor is formed at a position that overlaps the second mesa in the first direction, and on two sides of the second mesa,
in the light emitting region, the second semiconductor layer and the third semiconductor layer are each provided on two sides of the first mesa,
the fourth semiconductor layer is provided on the third semiconductor layer and above the first mesa, and
the first semiconductor layer, the second semiconductor layer, the third semiconductor layer, and the fourth semiconductor layer form a second thyristor on the two sides of the first mesa.

9. A method of manufacturing a semiconductor optical device in which a light emitting region that emits light and a reflecting region that reflects the light to the light emitting region side are integrated, the method comprising:
growing, on a first semiconductor layer of a first conductivity type, a core layer in the light emitting region;
growing, on the first semiconductor layer in the reflecting region, a waveguide layer that is optically coupled to the core layer and that has a band gap that is larger than energy of the light;
forming, in the reflecting region, a first thyristor that overlaps the waveguide layer in a first direction that is a direction that intersects a propagation direction of the light;
growing, on the waveguide layer, a first embedding layer of a second conductivity type, the second conductivity type differing from the first conductivity type;
etching the first semiconductor layer and the core layer to form a first mesa that protrudes in the first direction;
etching the first semiconductor layer and the waveguide layer to form a second mesa that protrudes in the first direction;
growing, on the waveguide layer, a second embedding layer of the second conductivity type, and forming a second semiconductor layer with the first embedding layer and the second embedding layer;
changing a dopant from the second conductivity type to the first conductivity type and a third semiconductor layer of the first conductivity type on the second semiconductor layer;
growing a fourth semiconductor layer of the second conductivity type on the core layer and above the second semiconductor layer; and
forming, in the reflecting region using the first semiconductor layer, the second semiconductor layer, the third semiconductor layer, and the fourth semiconductor layer, a first thyristor that overlaps the waveguide layer in the first direction and at a position that overlaps the second mesa in the first direction, and on two sides of the second mesa, wherein
the first mesa and the second mesa extend in the propagation direction of the light and are adjacent to each other,
in the light emitting region, the second semiconductor layer and the third semiconductor layer are each provided on two sides of the first mesa,
the fourth semiconductor layer is provided on the third semiconductor layer and above the first mesa, and
the first semiconductor layer, the second semiconductor layer, the third semiconductor layer, and the fourth semiconductor layer form a second thyristor on the two sides of the first mesa.

* * * * *